US012112996B2

(12) United States Patent
Kamei et al.

(10) Patent No.: US 12,112,996 B2
(45) Date of Patent: *Oct. 8, 2024

(54) SEMICONDUCTOR DEVICE, IMAGING UNIT, AND ELECTRONIC APPARATUS

(71) Applicant: SONY SEMICONDUCTOR SOLUTIONS CORPORATION, Kanagawa (JP)

(72) Inventors: Takahiro Kamei, Kanagawa (JP); Yoichi Ootsuka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 64 days.

This patent is subject to a terminal disclaimer.

(21) Appl. No.: 18/046,387

(22) Filed: Oct. 13, 2022

(65) Prior Publication Data

US 2023/0060413 A1    Mar. 2, 2023

Related U.S. Application Data

(63) Continuation of application No. 16/978,576, filed as application No. PCT/JP2019/005808 on Feb. 18, 2019, now Pat. No. 11,488,893.

(30) Foreign Application Priority Data

Mar. 14, 2018  (JP) ................. 2018-046712

(51) Int. Cl.
*H01L 23/48*      (2006.01)
*H01L 21/768*     (2006.01)
(Continued)

(52) U.S. Cl.
CPC ...... *H01L 23/481* (2013.01); *H01L 21/76898* (2013.01); *H01L 27/14634* (2013.01)

(58) Field of Classification Search
CPC ............. H01L 23/481; H01L 21/76898; H01L 27/14634; H01L 27/14636; H01L 23/12;
(Continued)

(56) References Cited

U.S. PATENT DOCUMENTS 11,488,893 B2 * 11/2022 Kamei ................ H01L 27/1469
2005/0199995 A1     9/2005 Nomoto et al.
(Continued)

FOREIGN PATENT DOCUMENTS

CN         1681117 A      10/2005
JP       2000-340566 A    12/2000
(Continued)

OTHER PUBLICATIONS

International Search Report and Written Opinion of PCT Application No. PCT/JP2019/005808, issued on May 21, 2019, 08 pages of English Translation and 08 pages of ISRWO.
(Continued)

*Primary Examiner* — Herve-Louis Y Assouman
(74) *Attorney, Agent, or Firm* — CHIP LAW GROUP

(57) ABSTRACT

Provided is a semiconductor device having high planarity in an in-plane direction. This semiconductor device includes a semiconductor substrate, a first plating film pattern, a second plating film pattern, and an insulating layer. The semiconductor substrate has a first surface, and a second surface on a side opposite to the first surface. The first plating film pattern includes a first portion that covers a first regional portion of the first surface, and a second portion that is stacked to cover a portion of the first portion. The second plating film pattern includes a third portion that covers a second regional portion different from the first regional portion of the first surface, and also includes a fourth portion that is stacked to cover a portion of the third portion. A
(Continued)

portion between the second portion and the fourth portion is filled with the insulating layer.

19 Claims, 26 Drawing Sheets

(51) Int. Cl.
*H01L 23/12* (2006.01)
*H01L 25/065* (2023.01)
*H01L 25/07* (2006.01)
*H01L 25/18* (2023.01)
*H01L 27/146* (2006.01)

(58) Field of Classification Search
CPC ....... H01L 25/065; H01L 25/07; H01L 25/18; H01L 27/1469; H04N 25/70
See application file for complete search history.

(56) References Cited

U.S. PATENT DOCUMENTS

| | | |
|---|---|---|
| 2009/0256260 A1 | 10/2009 | Nakamura |
| 2011/0233702 A1 | 9/2011 | Takahashi et al. |
| 2012/0044415 A1 | 2/2012 | Tsuduki et al. |
| 2016/0099206 A1 | 4/2016 | Margalit |
| 2017/0117320 A1 | 4/2017 | Matsugai |
| 2018/0019277 A1 | 1/2018 | Nagata et al. |
| 2019/0297287 A1 | 9/2019 | Oka et al. |

FOREIGN PATENT DOCUMENTS

| | | |
|---|---|---|
| JP | 2005-064451 A | 3/2005 |
| JP | 2005-158777 A | 6/2005 |
| JP | 2005-340590 A | 12/2005 |
| JP | 2011-249430 A | 12/2011 |
| JP | 2016-001681 A | 1/2016 |
| KR | 10-2006-0043622 A | 5/2006 |
| TW | 200601576 A | 1/2006 |
| TW | 201603256 A | 1/2016 |
| WO | 2015/190070 A1 | 12/2015 |

OTHER PUBLICATIONS

International Preliminary Report on Patentability of PCT Application No. PCT/JP2019/005808, issued on Sep. 24, 2020, 08 pages of English Translation and 05 pages of IPRP.
Notice of Allowance for U.S. Appl. No. 16/978,576, issued on Jul. 11, 2022, 9 pages.
Non-Final Office Action for U.S. Appl. No. 16/978,576, issued on Sep. 30, 2021, 18 pages.
Final Office Action for U.S. Appl. No. 16/978,576, issued on Mar. 2, 2022, 25 pages.

* cited by examiner

[FIG. 1A]
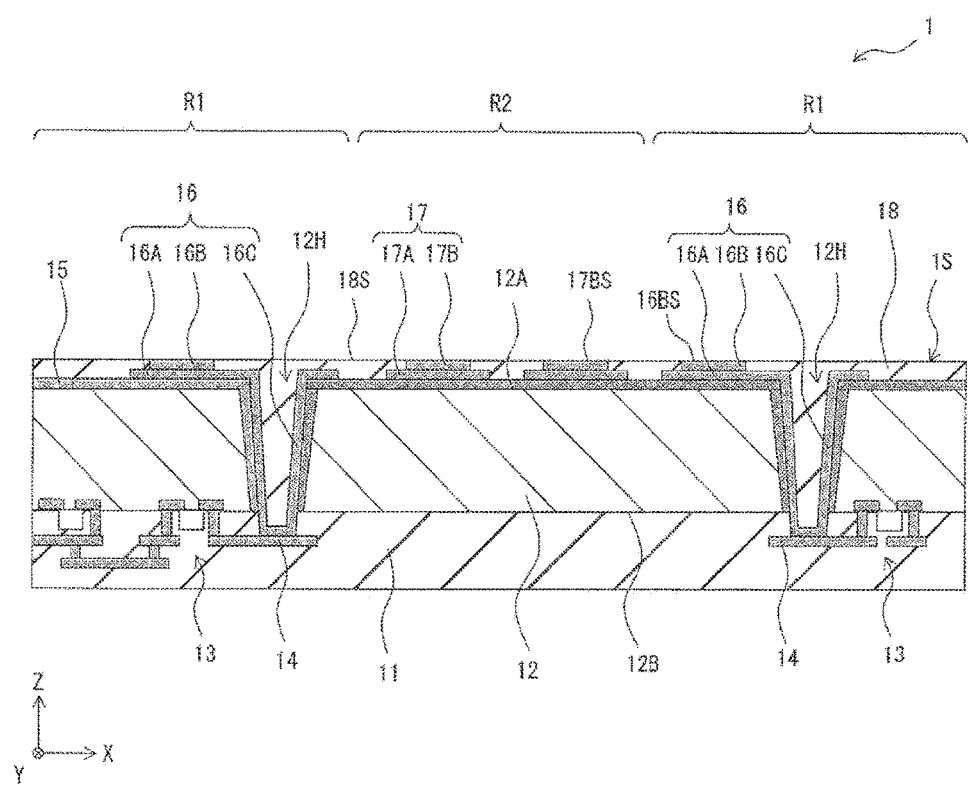

[FIG. 1B]
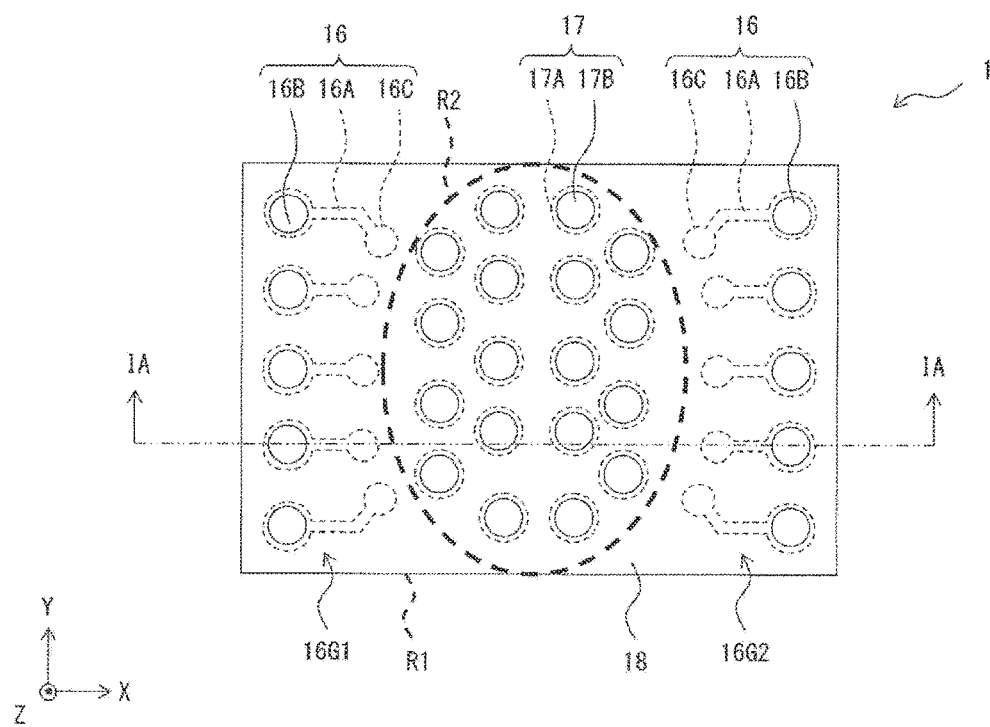

[FIG. 2A]
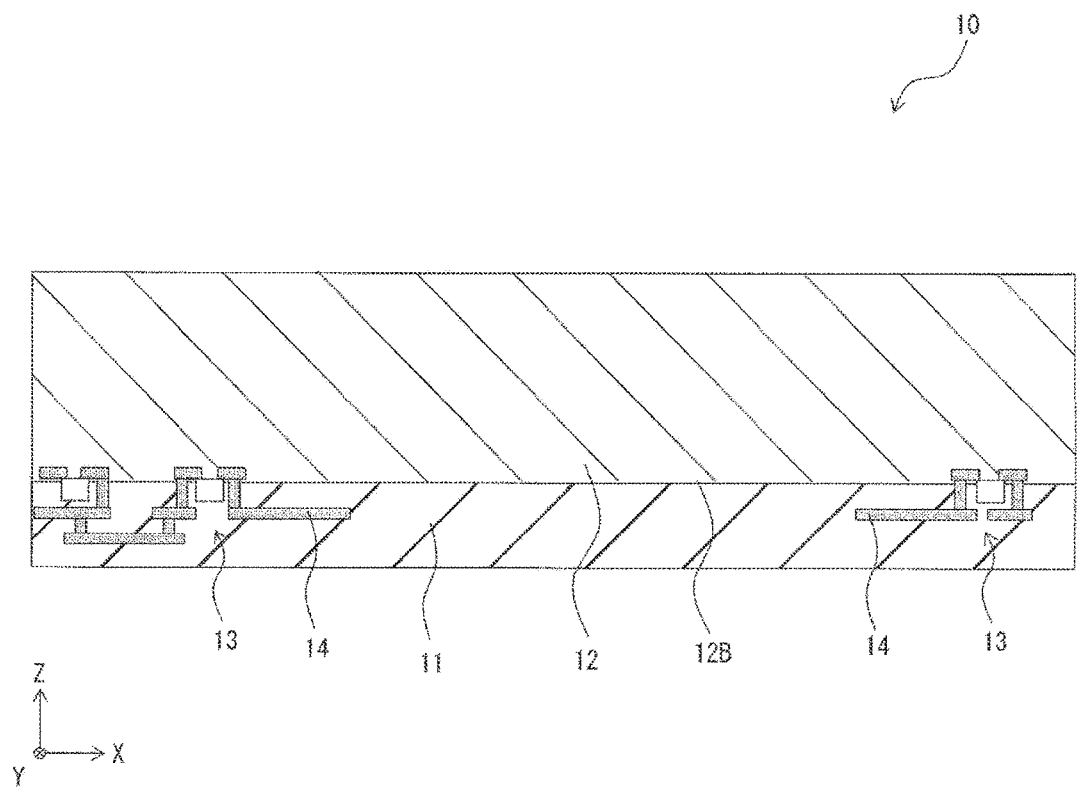

[FIG. 2B]
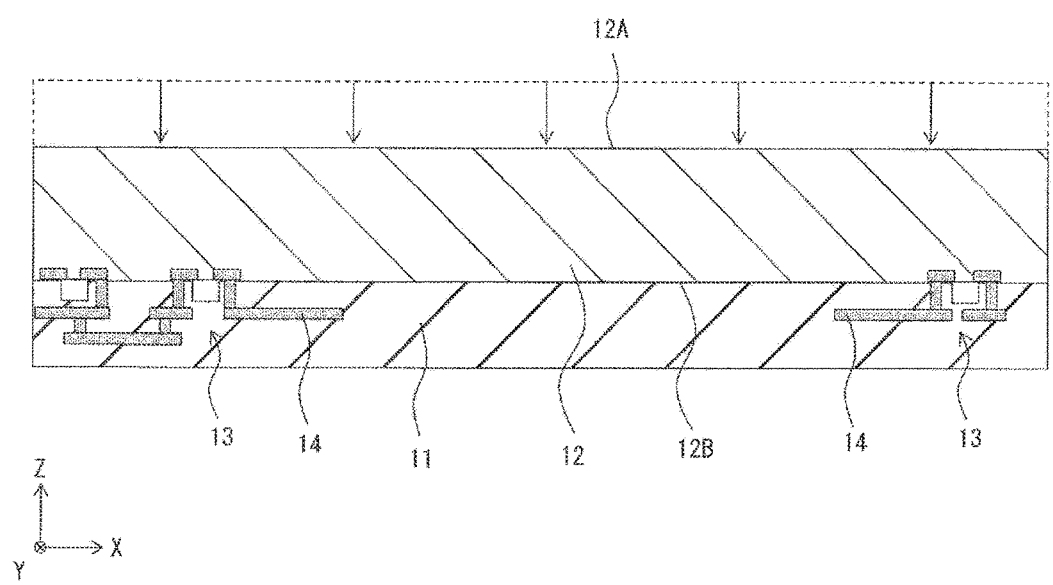

[FIG. 2C]
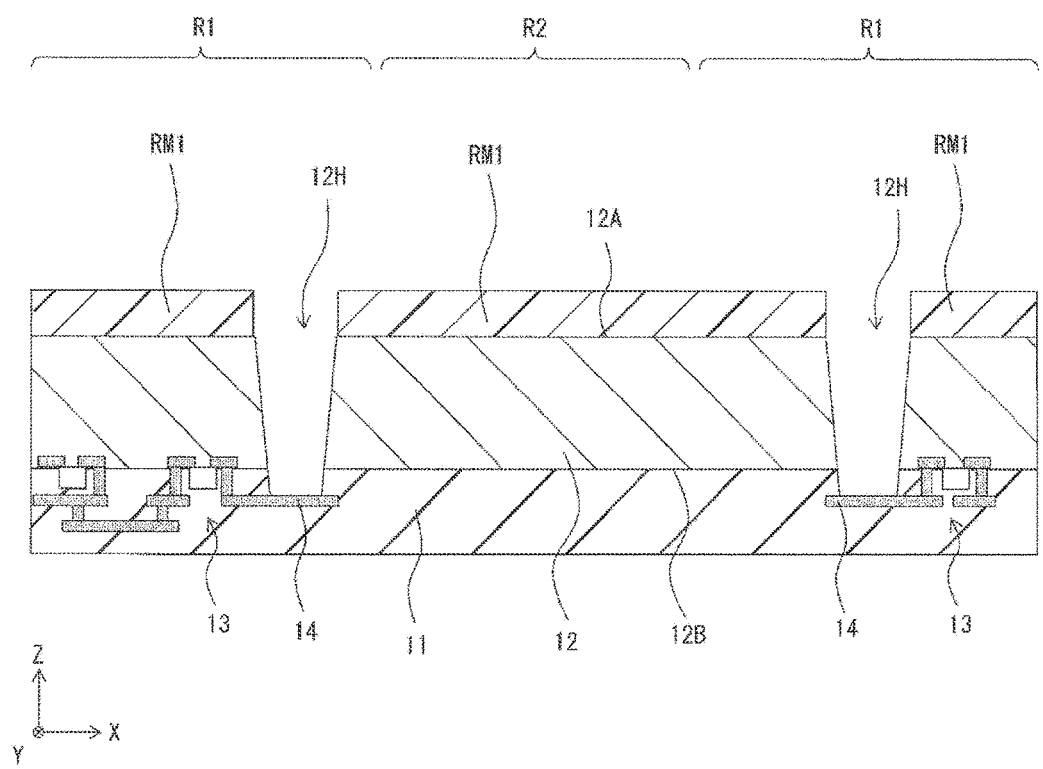

[FIG. 2D]
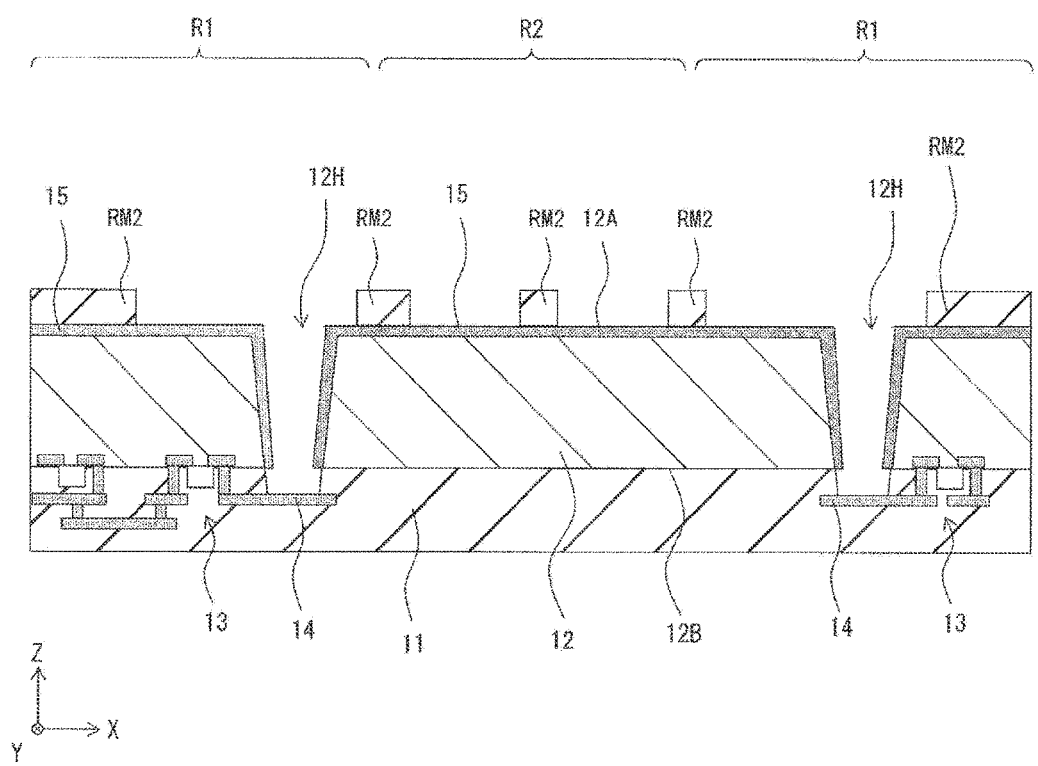

[FIG. 2E]
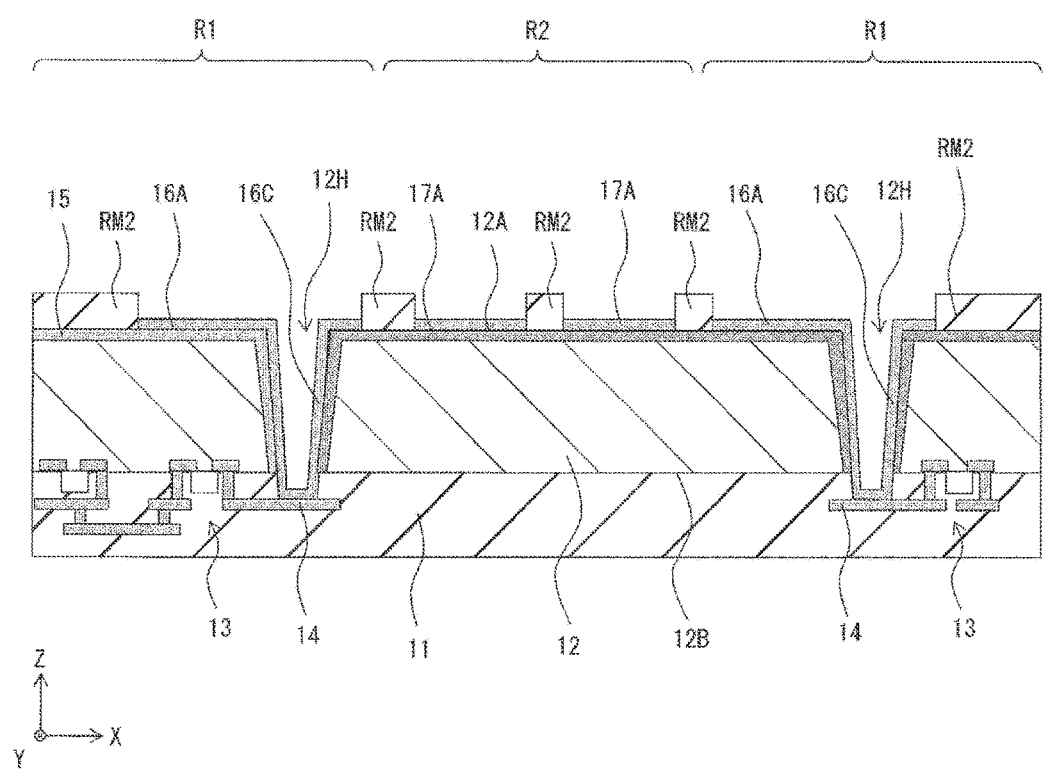

[FIG. 2F]
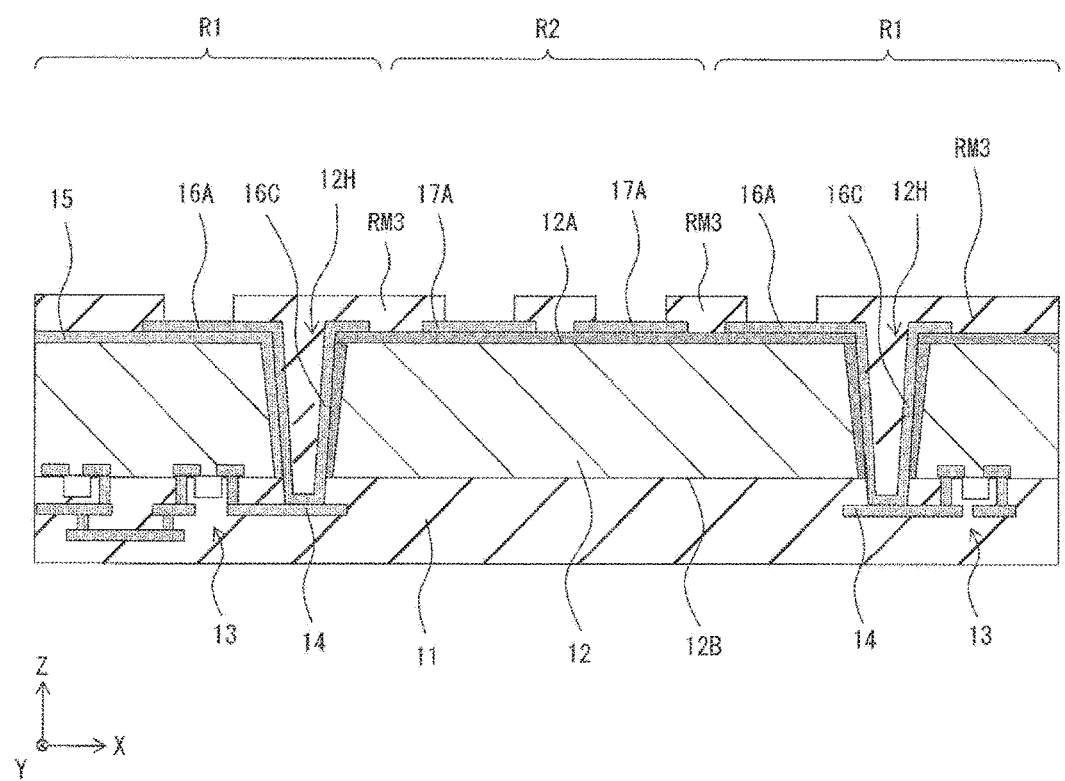

[FIG. 2G]
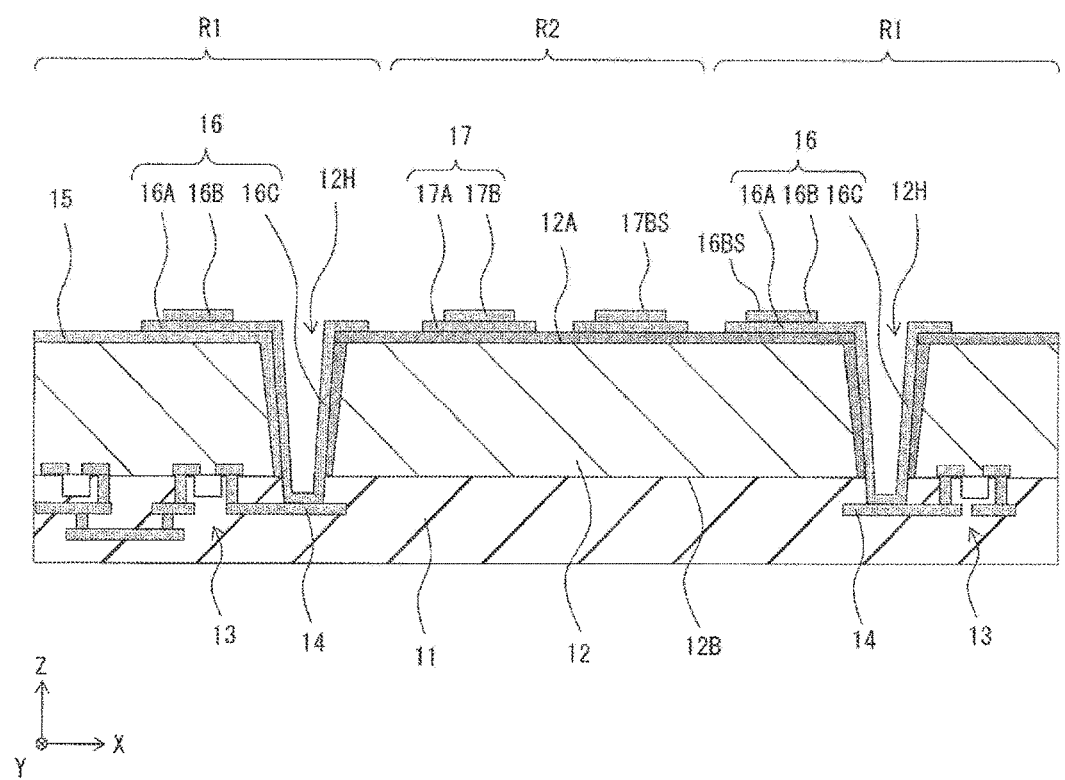

[FIG. 2H]
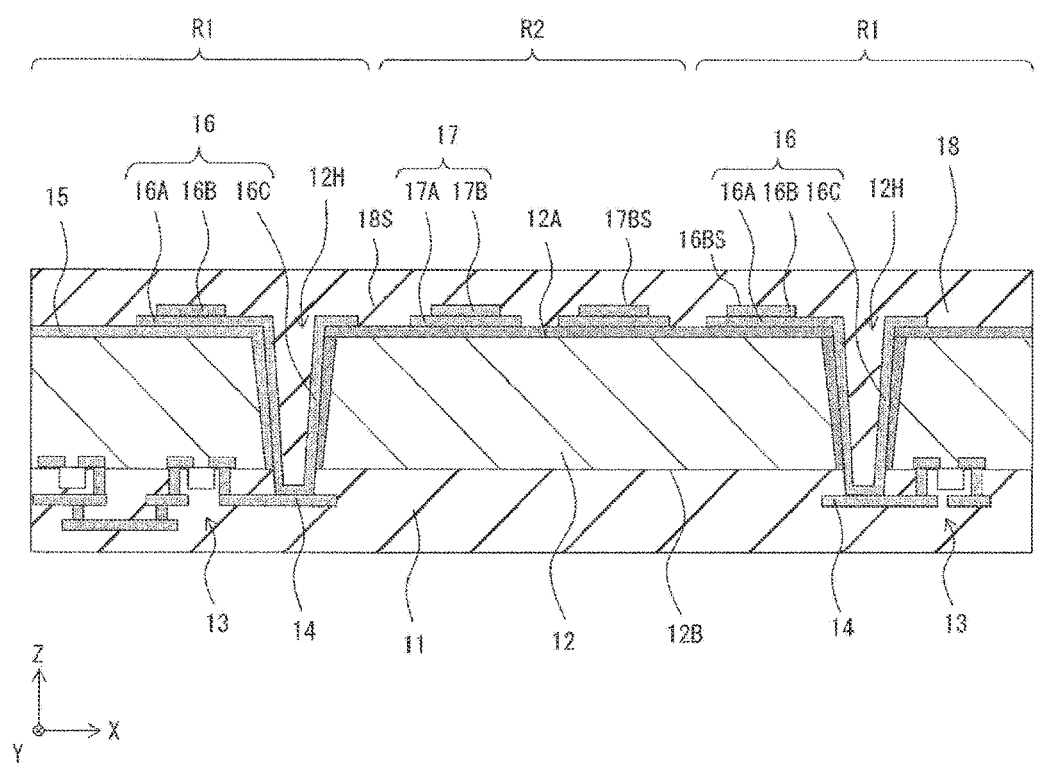

[FIG. 3A]
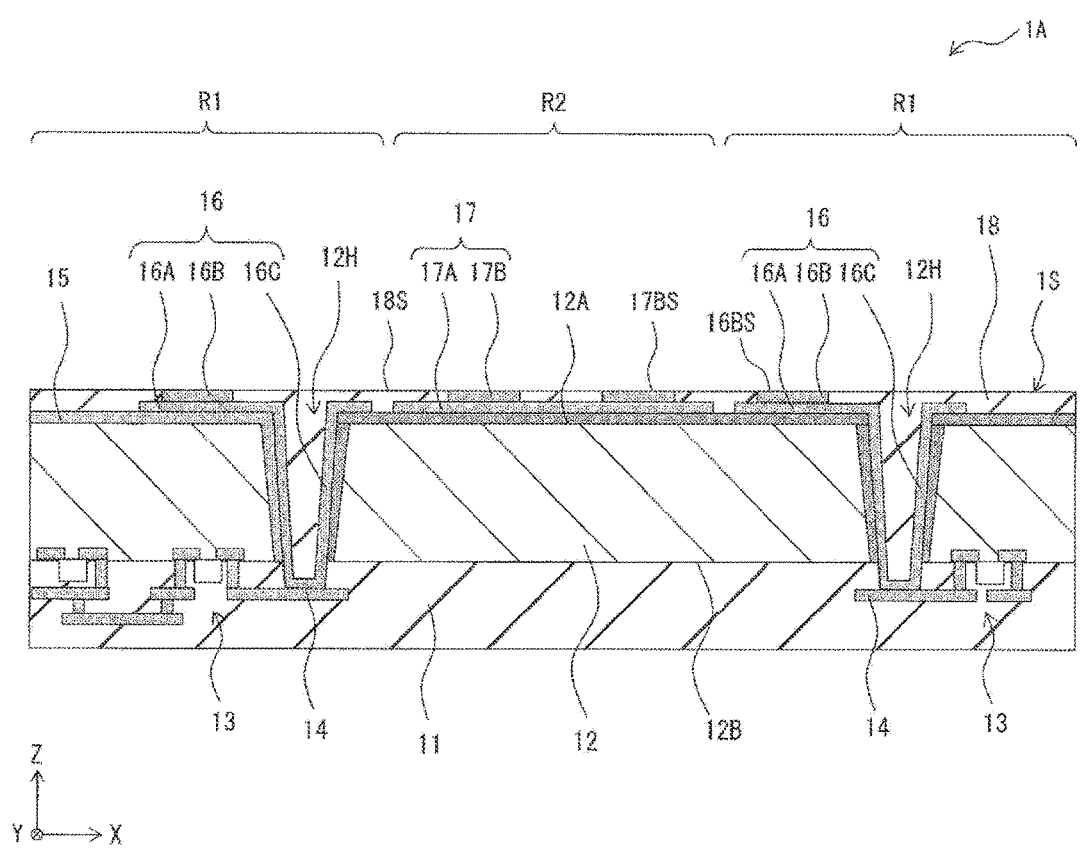

[FIG. 3B]
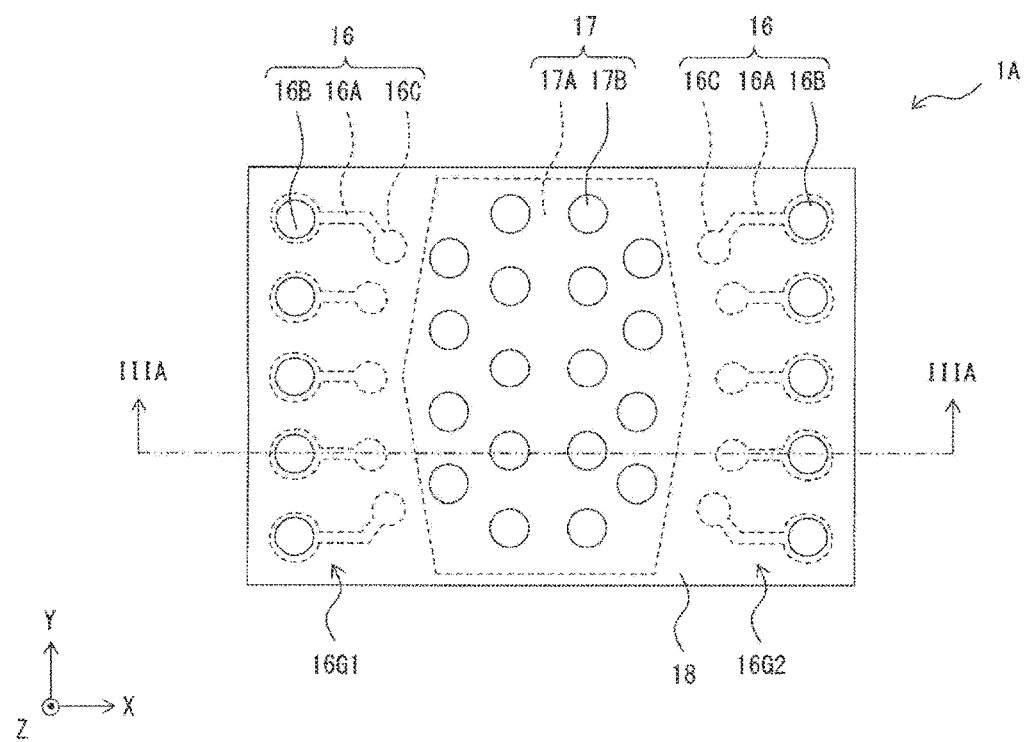

[FIG. 4]
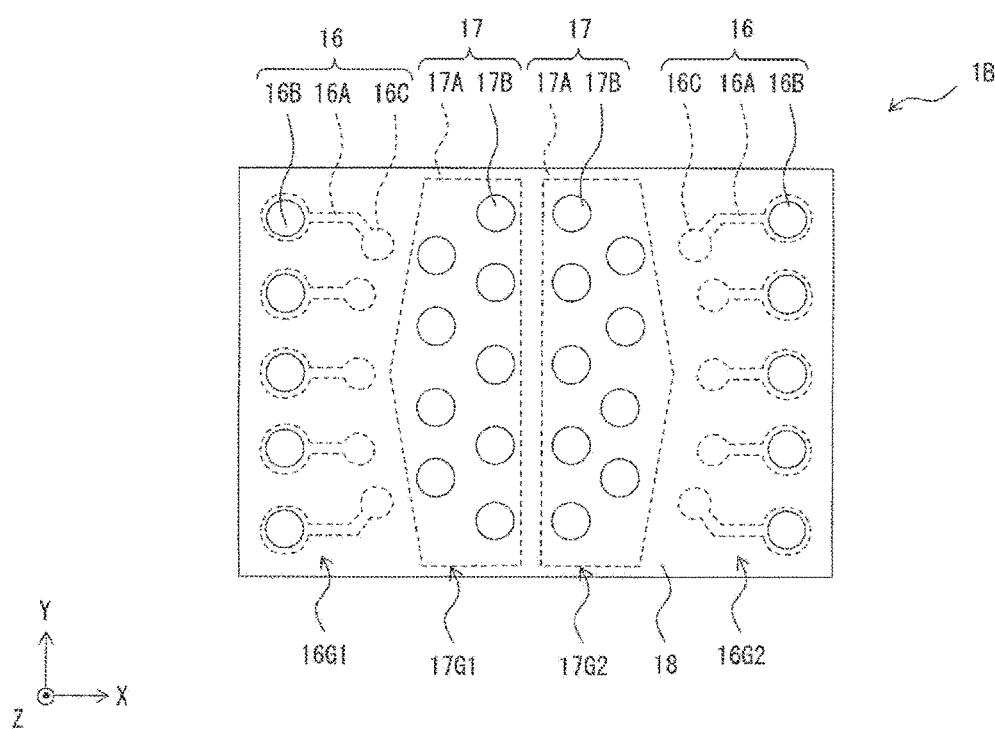

[FIG. 5A]
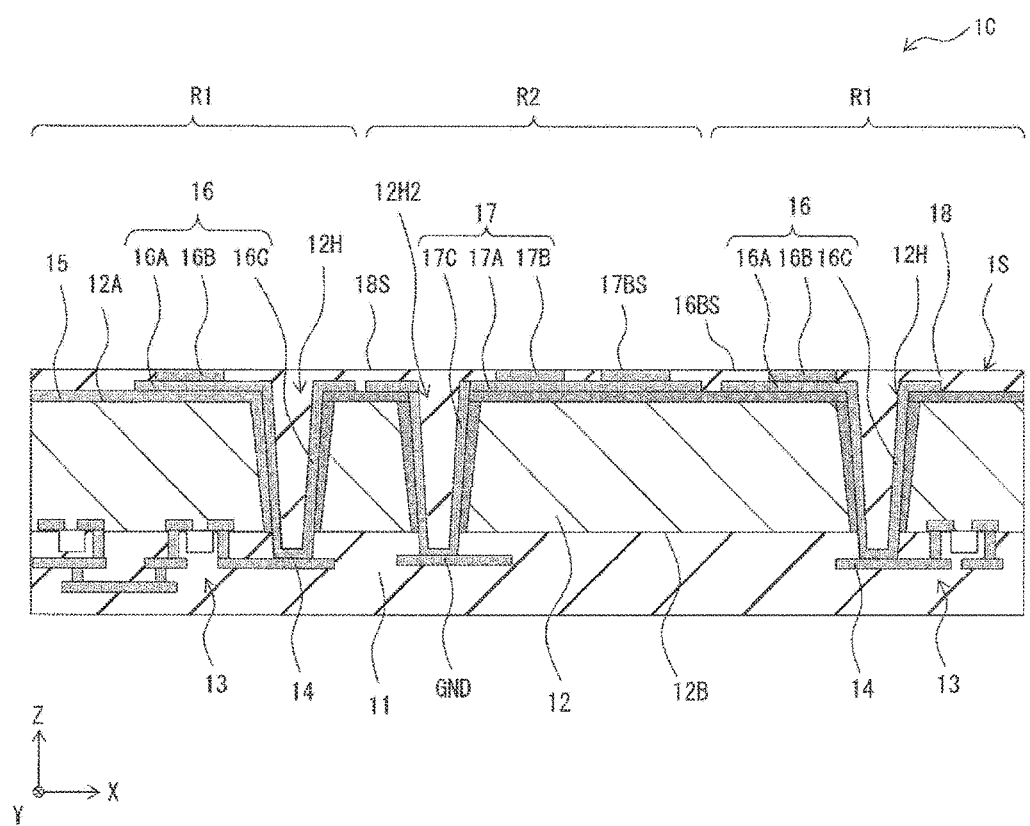

[FIG. 5B]
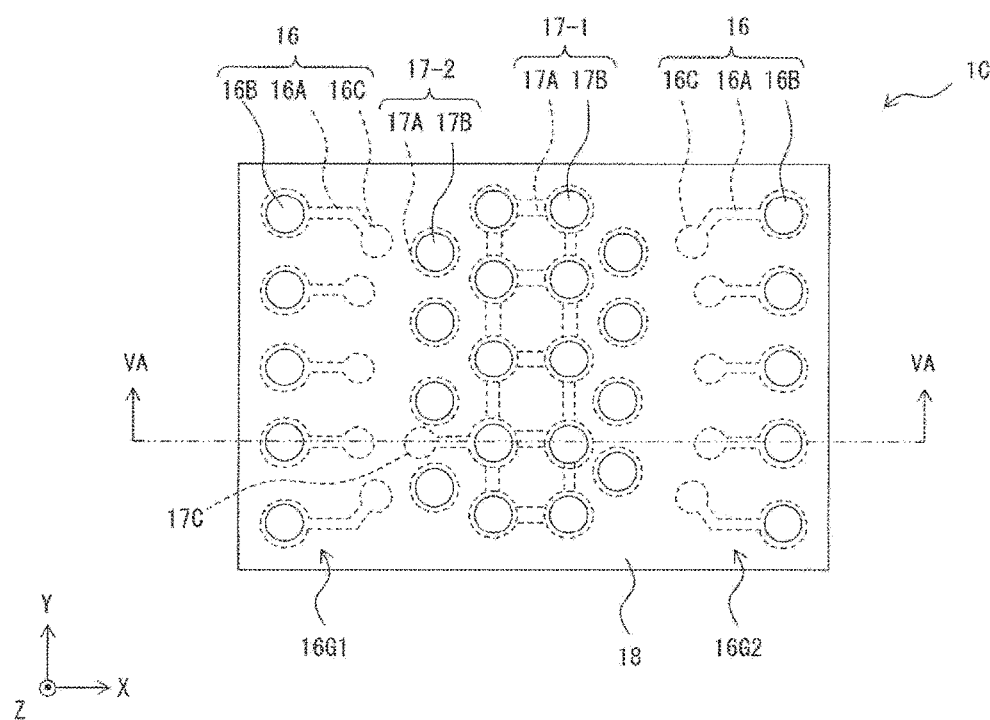

[FIG. 6A]
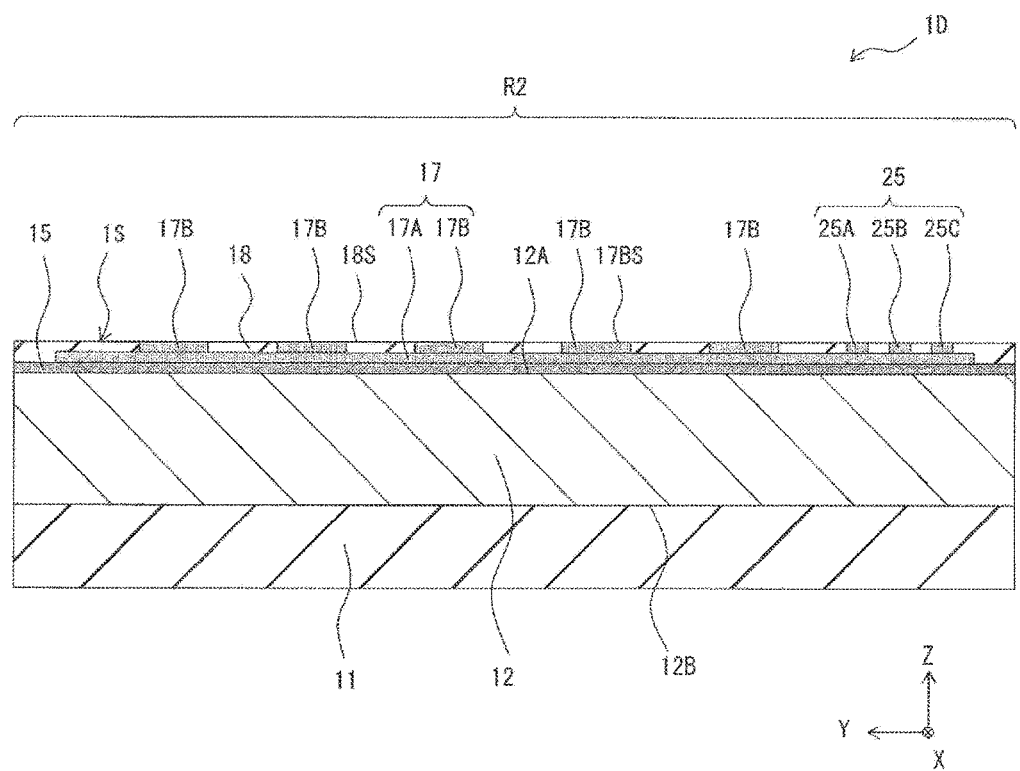

[FIG. 6B]
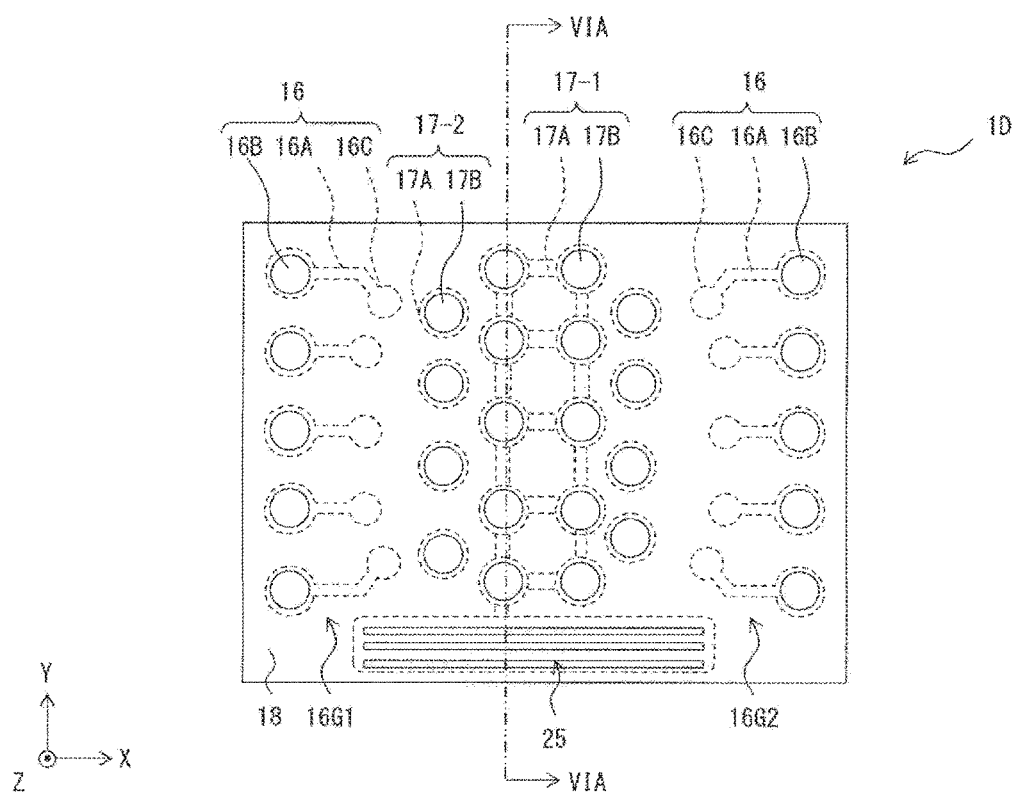

[FIG. 7]
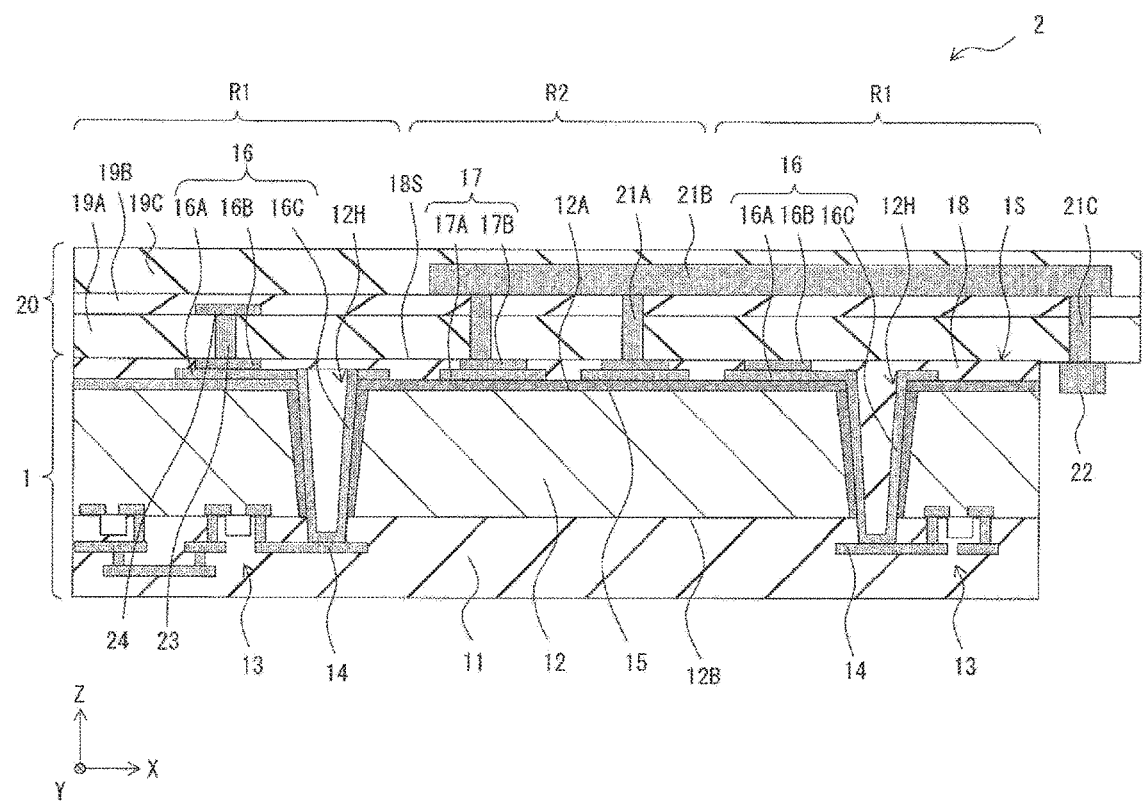

[FIG. 8A]
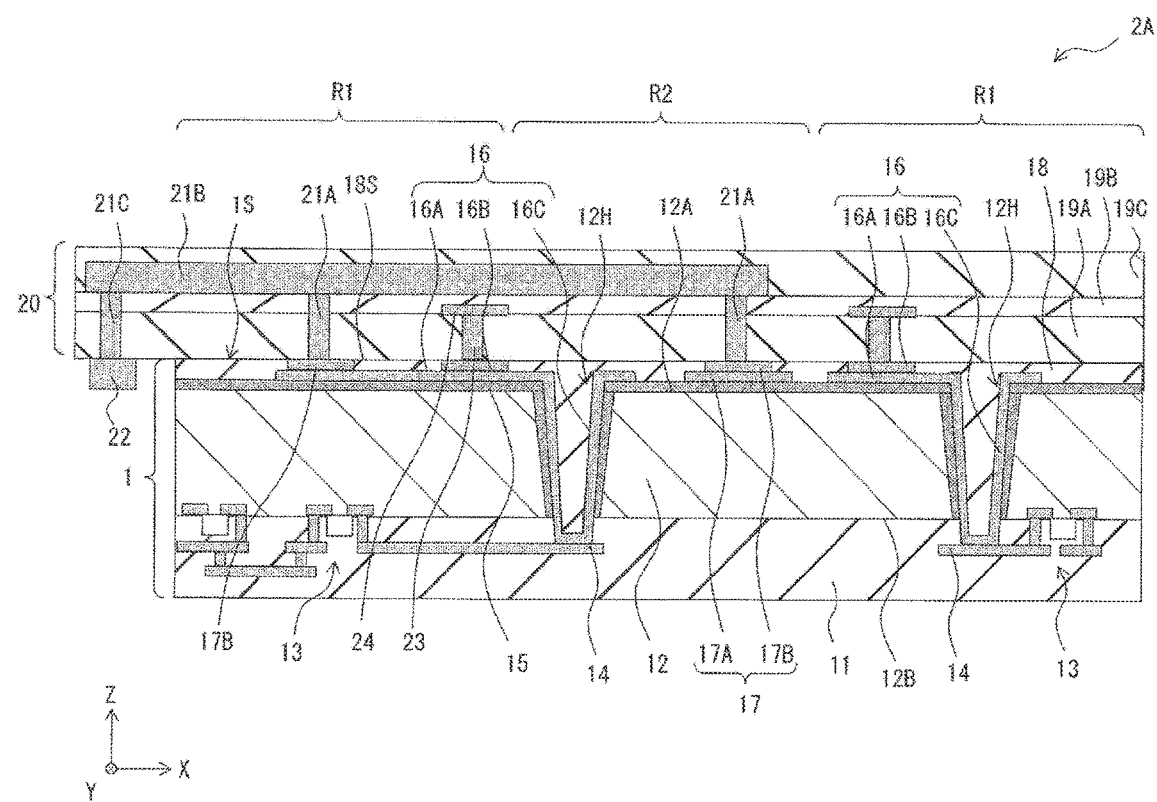

[FIG. 8B]
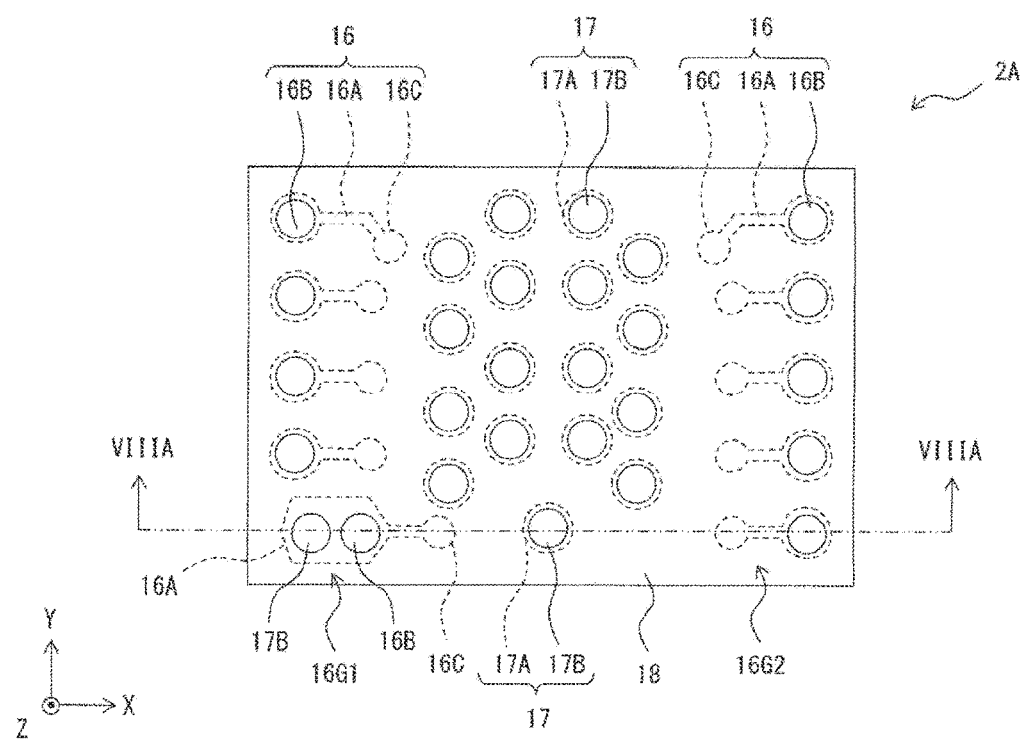

[FIG. 9]
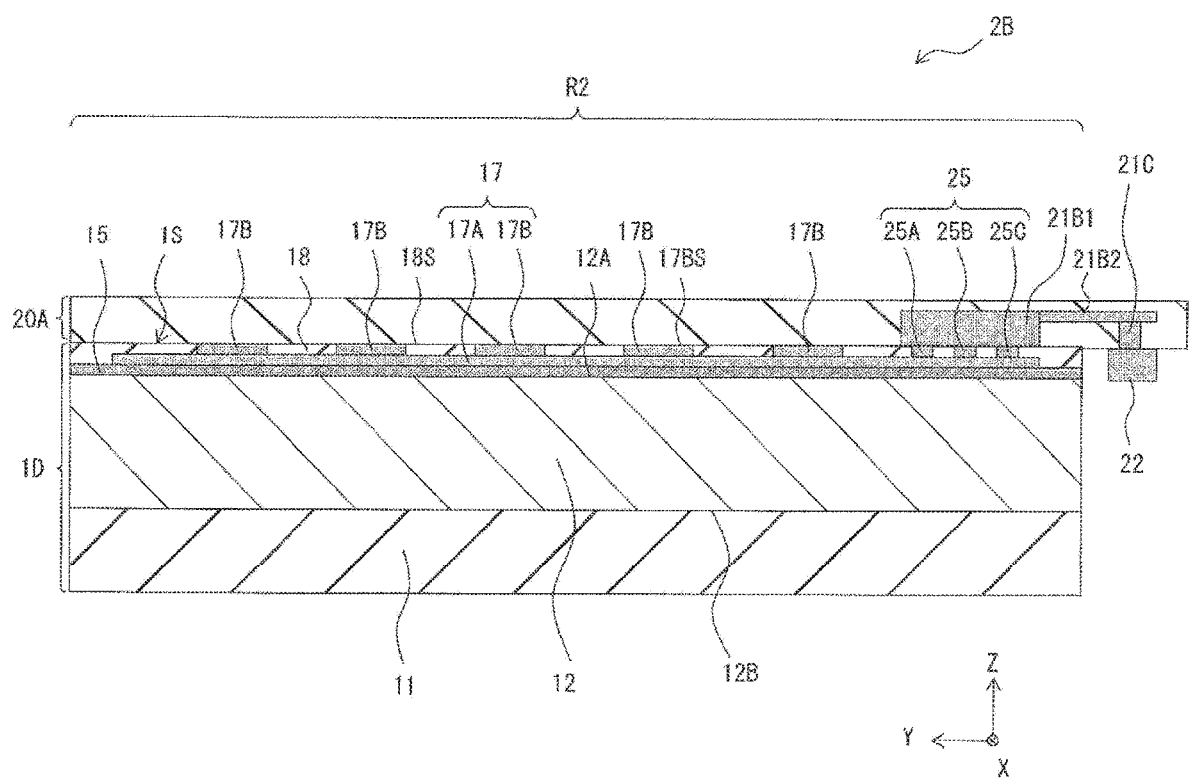

[FIG. 10]
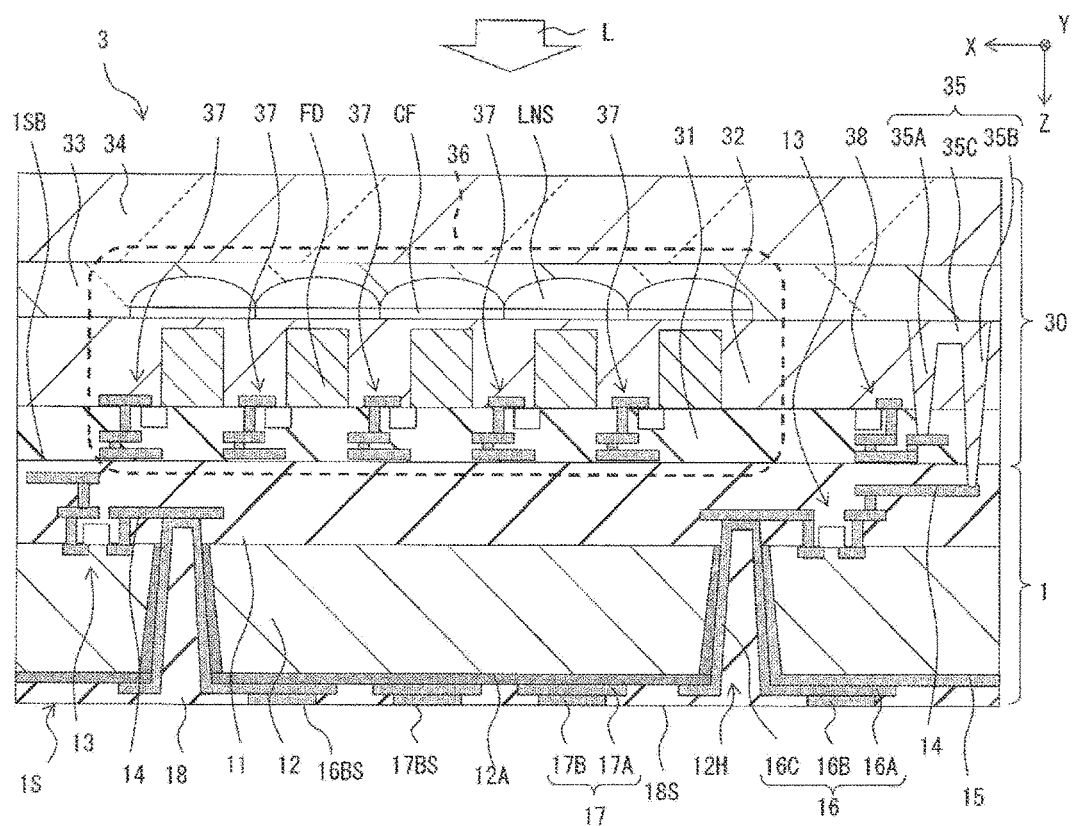

[FIG. 11]
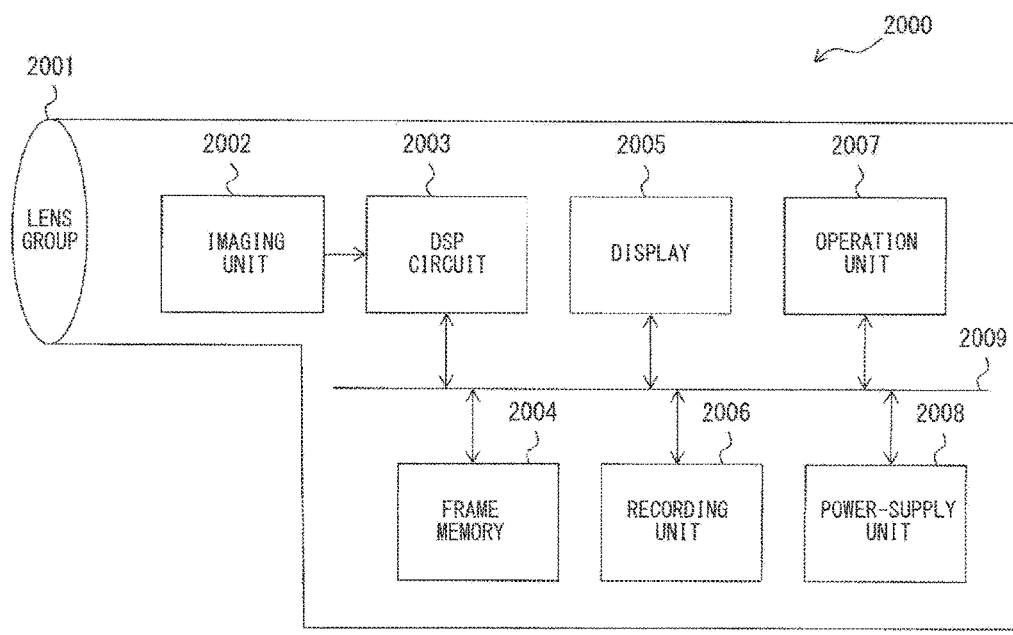

[FIG. 12]
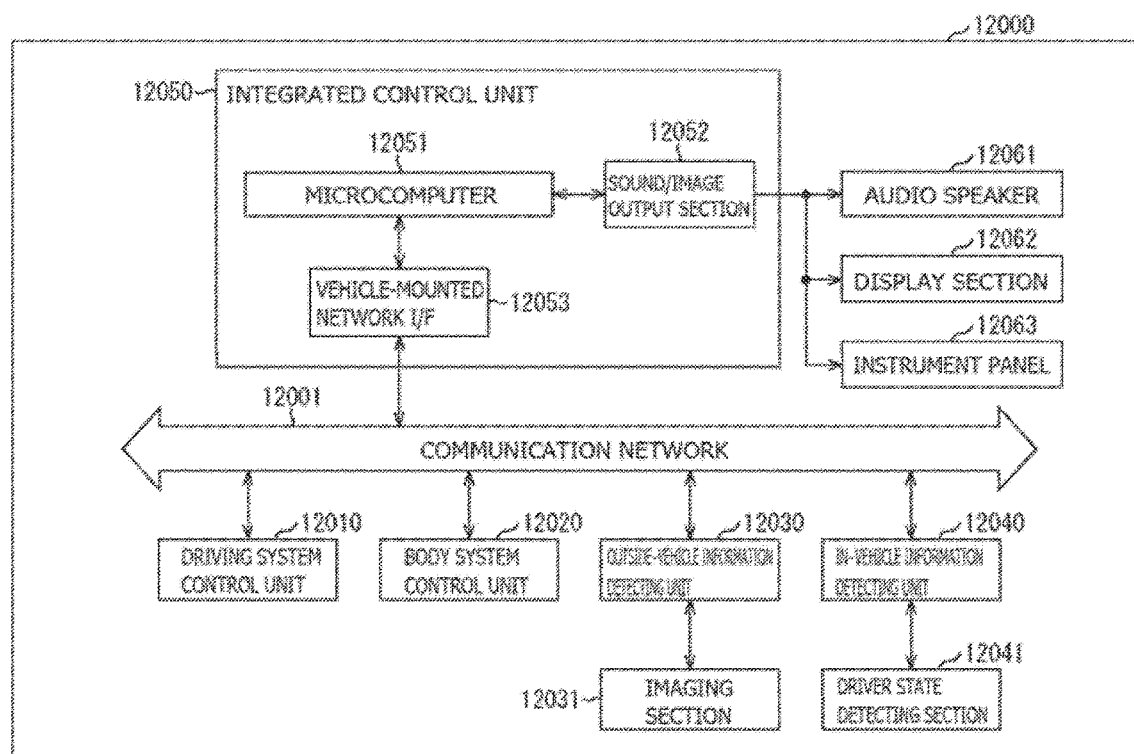

[FIG. 13]
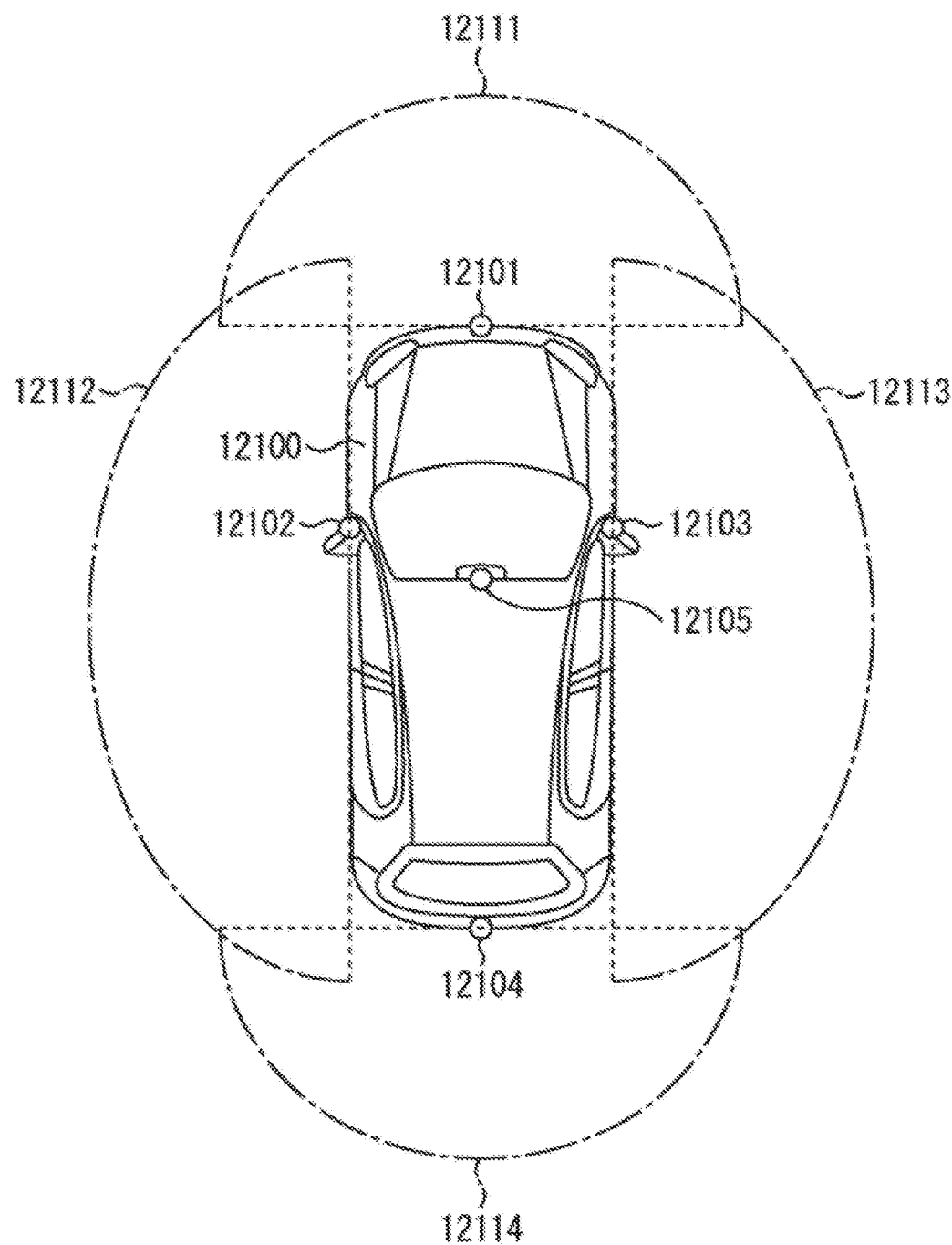

[FIG. 14]
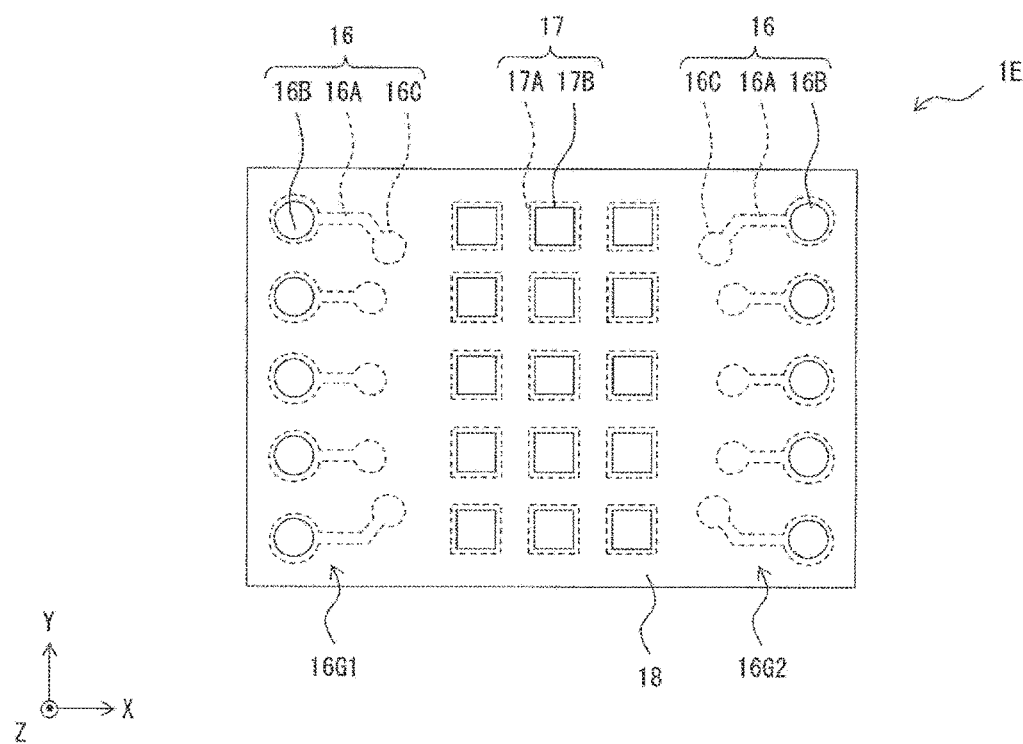

SEMICONDUCTOR DEVICE, IMAGING UNIT, AND ELECTRONIC APPARATUS

CROSS REFERENCE TO RELATED APPLICATIONS

This application is a continuation application of U.S. patent application Ser. No. 16/978,576, filed on Sep. 4, 2020, which is a U.S. National Phase of International Patent Application No. PCT/JP2019/005808 filed on Feb. 18, 2019, which claims the benefit of priority from Japanese Patent Application No. JP 2018-046712 filed in the Japan Patent Office on Mar. 14, 2018. Each of the above-referenced applications is hereby incorporated herein by reference in its entirety.

TECHNICAL FIELD

The present disclosure relates to a semiconductor device, and also relates to an imaging unit and an electronic apparatus, each of which includes the semiconductor device.

BACKGROUND ART

There has been proposed a semiconductor device (for example, PTL 1) that includes a semiconductor substrate having a semiconductor element formed on a front surface thereof, and also includes a through electrode that penetrates the semiconductor substrate from the front surface to the back surface and is coupled to the semiconductor element.

CITATION LIST

Patent Literature

PTL 1: Japanese Unexamined Patent Application Publication No. 2005-64451

SUMMARY OF THE INVENTION

Typically, such a semiconductor device is disposed, for example, in a manner in which the back surface of the semiconductor substrate is opposed to another substrate, and a through electrode is coupled to a terminal of the other substrate.

Thus, the back surface of the semiconductor substrate at which a through electrode is exposed is desired to have a high planarity in an in-plane direction.

A semiconductor device according to one embodiment of the present disclosure includes a semiconductor substrate, a first plating film pattern, a second plating film pattern, and an insulating layer. The semiconductor substrate has a first surface, and a second surface on a side opposite to the first surface. The first plating film pattern includes a first portion that covers a first regional portion of the first surface, and a second portion stacked to cover a portion of the first portion. The second plating film pattern includes a third portion that covers a second regional portion different from the first regional portion of the first surface, and a fourth portion stacked to cover a portion of the third portion. A portion between the second portion and the fourth portion is filled with the insulating layer.

According to the semiconductor device serving as one embodiment of the present disclosure, it is possible to achieve high planarity in an in-plane direction.

It should be noted that the effect of the present disclosure is not limited to this. Any effects described below may be achieved.

BRIEF DESCRIPTION OF THE DRAWINGS

FIG. 1A is a cross-sectional view of an example of an entire configuration of a semiconductor device according to a first embodiment of the present disclosure.

FIG. 1B is a plan view of the semiconductor device illustrated in FIG. 1A.

FIG. 2A is a cross-sectional view of one step of a method of manufacturing the semiconductor device illustrated in FIG. 1A.

FIG. 2B is a cross-sectional view of a step subsequent to FIG. 2A.

FIG. 2C is a cross-sectional view of a step subsequent to FIG. 2B.

FIG. 2D is a cross-sectional view of a step subsequent to FIG. 2C.

FIG. 2E is a cross-sectional view of a step subsequent to FIG. 2D.

FIG. 2F is a cross-sectional view of a step subsequent to FIG. 2E.

FIG. 2G is a cross-sectional view of a step subsequent to FIG. 2F.

FIG. 2H is a cross-sectional view of a step subsequent to FIG. 2G.

FIG. 3A is a cross-sectional view of an example of an entire configuration of a semiconductor device according to a first modification example of the first embodiment.

FIG. 3B is a plan view of an example of an entire configuration of the semiconductor device according to the first modification example of the first embodiment illustrated in FIG. 3A.

FIG. 4 is a plan view of an example of an entire configuration of a semiconductor device according to a second modification example of the first embodiment.

FIG. 5A is a cross-sectional view of an example of an entire configuration of a semiconductor device according to a third modification example of the first embodiment.

FIG. 5B is a plan view of an example of an entire configuration of the semiconductor device according to the third modification example of the first embodiment illustrated in FIG. 5A.

FIG. 6A is a cross-sectional view of an example of an entire configuration of a semiconductor device according to a fourth modification example of the first embodiment.

FIG. 6B is a plan view of an example of an entire configuration of the semiconductor device according to the fourth modification example of the first embodiment illustrated in FIG. 6A.

FIG. 7 is a cross-sectional view of an example of an entire configuration of a semiconductor unit according to a second embodiment of the present disclosure.

FIG. 8A is a cross-sectional view of an example of an entire configuration of a semiconductor unit according to a first modification example of the second embodiment.

FIG. 8B is a plan view of an example of an entire configuration of the semiconductor unit according to the first modification example of the second embodiment illustrated in FIG. 8A.

FIG. 9 is a cross-sectional view of an example of an entire configuration of a semiconductor unit according to a second modification example of the second embodiment.

FIG. 10 is a cross-sectional view of an example of an entire configuration of an imaging unit according to a third embodiment of the present disclosure.

FIG. 11 is a schematic view of an example of an entire configuration of an electronic apparatus according to a fourth embodiment of the present disclosure.

FIG. 12 is a block diagram depicting an example of schematic configuration of a vehicle control system.

FIG. 13 is a diagram of assistance in explaining an example of installation positions of an outside-vehicle information detecting section and an imaging section.

FIG. 14 is a plan view of an example of an entire configuration of a semiconductor device according to another modification example of the present disclosure.

MODES FOR CARRYING OUT THE INVENTION

In the following, embodiments according to the present disclosure will be described in detail with reference to the drawings. Note that description will be given in the following order.

1. Example of Configuration of Semiconductor Device
2. Modification Examples of Semiconductor Device
3. Example of Configuration of Semiconductor Unit Including Semiconductor Device
4. Modification Example of Semiconductor Unit
5. Example of Configuration of Imaging Unit Including Semiconductor Device
6. Example of Application to Electronic Apparatus
7. Example of Application to Mobile Body
8. Other Modification Examples

1. First Embodiment: Example of Configuration of Semiconductor Device

[Configuration of Semiconductor Device 1]

FIGS. 1A and 1B are diagrams each schematically illustrating an example of an entire configuration of a semiconductor device 1 according to a first embodiment of the present disclosure. FIG. 1A illustrates a configuration of the semiconductor device 1 in cross section. FIG. 1B illustrates a configuration of the semiconductor device 1 in plan view. FIG. 1A corresponds to a cross-sectional view taken along the cutting line IA-IA illustrated in FIG. 1B and viewed in the direction of the arrow.

The semiconductor device 1 includes, for example, a semiconductor substrate 12, a first plating film pattern 16, a second plating film pattern 17, and a planarizing film 18 having an electrically insulating property. In a case of the present embodiment, a plane where the semiconductor substrate 12 extends is set as an X-Y plane. In addition, a direction of thickness of the semiconductor substrate 12 is set as a Z direction.

(Semiconductor Substrate 12)

The semiconductor substrate 12 includes a semiconductor material such as silicon, for example. The semiconductor substrate 12 also has a front surface 12A, and a back surface 12B on a side opposite to the front surface 12A. The front surface 12A is provided with the first plating film pattern 16 and the second plating film pattern 17 with an insulating layer 15 in between. The insulating layer 15 is formed, for example, through a plasma chemical vapor deposition method (CVD method). The insulating layer 15 includes an insulating material such as SiO2 or SiN. The insulating layer 15 has an electrically insulating property. In addition, the back surface 12B is provided with a semiconductor circuit including a transistor 13 serving, for example, as a semiconductor element and a wiring line 14. The back surface 12B is covered with an insulating layer 11 in which the semiconductor circuit is embedded. In addition, the semiconductor substrate 12 includes a through hole 12H running from the front surface 12A to the back surface 12B.

The first plating film pattern 16 includes a highly electrically conductive metal such as Cu (copper), for example, and is formed through a plating method. The first plating film pattern 16 is provided in a first regional portion R1 of the front surface 12A. The first plating film pattern 16 includes, for example, a plating film. The first plating film pattern 16 includes a first portion 16A that covers a portion of the first regional portion R1, and a second portion 16B stacked to cover a portion of the first portion 16A. The first plating film pattern 16 further includes a through-hole portion 16C provided in a manner in which the through-hole portion 16C covers the inner surface of the through hole 12H, the through-hole portion 16C being coupled to the first portion 16A. The through-hole portion 16C is coupled to the transistor 13 through the wiring line 14. Here, it is preferable that the first portion 16A and the through-hole portion 16C be formed integrally in the first plating film pattern 16 through a plating method or the like.

As illustrated in FIG. 1B, the semiconductor device 1 includes a first plating film pattern group 16G1 provided on a left side of a second regional portion R2 on the paper surface, the second regional portion R2 being described later, and also includes a first plating film pattern group 16G2 provided on a right side of the second regional portion R2 on the paper surface. The first plating film pattern group 16G1 includes, for example, five first plating film patterns 16. The first plating film pattern group 16G2 includes, for example, five first plating film patterns 16. Note that FIG. 1B illustrates, as an example, a case in which the semiconductor device 1 includes ten pieces of first plating film patterns 16. However, in a case of the present embodiment, the number of first plating film patterns 16 is not specifically limited. The number of first plating film patterns 16 may be one, or may be a plurality of pieces other than ten pieces.

The second plating film pattern 17 includes a highly electrically conductive material such as Cu (copper), for example, and is provided in the second regional portion R2 different from the first regional portion R1 of the front surface 12A. The second regional portion R2 is surrounded by the first regional portion R1 as illustrated, for example, in FIG. 1B. The second plating film pattern 17 includes a third portion 17A that covers a portion of the second regional portion R2, and also includes a fourth portion 17B stacked in a manner in which the fourth portion 17B covers a portion of the third portion 17A. Note that FIG. 1B illustrates, as an example, a case in which the semiconductor device 1 includes 18 pieces of second plating film patterns 17 provided in a decentralized manner. However, in a case of the present embodiment, only one second plating film pattern 17 may be provided, or a plurality of second plating film patterns 17 other than 18 pieces may be provided.

It is desirable that the first plating film pattern 16 include a constituent material that is substantially identical to that of the second plating film pattern 17. One reason for this is that the first plating film pattern 16 and the second plating film pattern 17 are able to be formed at a time, which is advantageous in terms of improvement in productivity when the semiconductor device 1 is manufactured.

Furthermore, in the semiconductor device 1, the first plating film pattern 16 and the second plating film pattern 17 are electrically separate.

In addition, in the semiconductor device 1, a plurality of second plating film patterns 17 is disposed between the first plating film pattern group 16G1 and the first plating film pattern group 16G2 in an in-plane direction along the front surface 12A.

(Planarizing Film 18)

The planarizing film 18 includes an organic insulating material such as epoxy or polyimide, for example. The planarizing film 18 is provided in a manner in which at least a portion between the second portion 16B and the fourth portion 17B is filled with the planarizing film 18. Note that, in a case of the example of the semiconductor device 1 illustrated in FIG. 1A, the planarizing film 18 is provided so as to cover the insulating layer 15, and at the same time, fill the space between the first portion 16A and the third portion 17A. In other words, an upper surface 16BS of the second portion 16B of the first plating film pattern 16 and an upper surface 17BS of the fourth portion 17B of the second plating film pattern 17 are each exposed at a surface 1S of the semiconductor device 1. In addition, an upper surface 18A of the planarizing film 18 is exposed at the surface 1S, as with the upper surface 16BS of the second portion 16B and the upper surface 17BS of the fourth portion 17B. Here, it is desirable that the height position of the upper surface 18A of the planarizing film 18, the height position of the upper surface 16BS of the second portion 16B, and the height position of the upper surface 17BS of the fourth portion 17B be all substantially equal to each other. One reason for this is that, for example, this makes it easy to couple the first plating film pattern to a wiring line provided on another substrate or the like at the time of mounting on a member such as the other substrate, which makes it possible to improve handleability. Note that the height position as used herein means a position in the Z direction orthogonal to the front surface 12A, in other words, a position in the height direction.

[Method of Manufacturing Semiconductor Device 1]

Next, a method of manufacturing the semiconductor device 1 will be described with reference to FIGS. 1A and 1B as well as FIGS. 2A, 2B, 2C, 2D, 2E, 2F, 2G, and 2H. FIGS. 2A, 2B, 2C, 2D, 2E, 2F, 2G, and 2H are cross-sectional views of a step in the method of manufacturing the semiconductor device 1.

First, as illustrated in FIG. 2A, a structure body 10 is prepared, the structure body 10 being provided in a manner in which the insulating layer 11 covers the back surface 12B of the semiconductor substrate 12. A semiconductor circuit including the transistor 13 and the wiring line 14 is formed on the back surface 12B.

Next, as illustrated in FIG. 2B, the semiconductor substrate 12 is polished from a side opposite to the back surface 12B to adjust the thickness of the semiconductor substrate 12 on an as-necessary basis to form the front surface 12A.

Then, as illustrated in FIG. 2C, the through hole 12H is formed in the first regional portion R1 of the front surface 12A of the semiconductor substrate 12. Formation of the through hole 12H is achieved, for example, by selectively forming a resist mask RM1 that covers a portion of the front surface 12A, and then, selectively removing the semiconductor substrate 12 through a dry etching method using the resist mask RM1.

Next, as illustrated in FIG. 2D, after the resist mask RM1 is removed, the insulating layer 15 that covers the entire surface is formed. The insulating layer 15 is formed, for example, through a PCVD method. After this, a portion of the insulating layer 15 that covers a bottom surface of the through hole 12H is removed through an etch-back method.

This allows a portion of the wiring line 14 that is the bottom surface of the through hole 12H to be exposed. In addition, a resist mask RM2 is selectively formed in a manner in which the resist mask RM2 covers a region of the insulating layer 15, this region being a region other than the region where the first portion 16A and the third portion 17A are to be formed.

Then, as illustrated in FIG. 2E, the first portion 16A and the third portion 17A are formed through a plating method in a region that is not covered with the resist mask RM2.

Next, as illustrated in FIG. 2F, after the resist mask RM2 is removed, a resist mask RM3 is selectively formed in a manner in which the resist mask RM3 covers a region other than the region where the second portion 16B and the fourth portion 17B are to be formed.

After this, as illustrated in FIG. 2G, the second portion 16B and the fourth portion 17B are formed through a plating method in a region that is not covered with the resist mask RM2. Then, the resist mask RM3 is removed. This makes it possible to complete the first plating film pattern 16 and the second plating film pattern 17.

Next, as illustrated in FIG. 2H, the planarizing film 18 is formed through a coating method or the like in a manner in which the planarizing film 18 also covers the entire surface, that is, the upper surface 16BS of the second portion 16B and the upper surface 17BS of the fourth portion 17B. Finally, a planarizing process is entirely performed though a CMP method or the like to form the surface 1S. This makes it possible to complete the semiconductor device 1 illustrated in FIG. 1A.

[Workings and Effects of Semiconductor Device 1]

As described above, in a case of the semiconductor device 1 according to the present embodiment, in addition to the first plating film pattern 16 coupled to the transistor 13 in the semiconductor circuit, the second plating film pattern 17 is provided on the front surface 12A of the semiconductor substrate 12. This second plating film pattern 17 is a dummy pattern that is electrically isolated. The second plating film pattern 17 has the upper surface 17BS exposed at the surface 1S. As described above, with the first plating film pattern 16 and the second plating film pattern 17 being provided on the front surface 12A, it is possible to adjust a surface density of a plating film exposed at the surface 1S of the semiconductor device 1, as compared with a case where only the first plating film pattern 16 is provided. This makes it possible to reduce, in the entire semiconductor device 1, a variation in thickness of each plating film in the in-plane direction of the surface 1S, that is, the total thickness of the thickness of the first portion 16A and the thickness of the second portion 16B. Thus, planarity of the surface 1S of the semiconductor device 1 improves.

Furthermore, in a case of the semiconductor device 1 according to the present embodiment, the first plating film pattern 16 has a two-layer structure with the first portion 16A and the second portion 16B, whereas the second plating film pattern 17 has a two-layer structure with the third portion 17A and the fourth portion 17B. Thus, it is possible to effectively prevent dishing of the first plating film pattern 16 when the surface 1S is formed through a planarizing process. If each plating film pattern has a single layer structure as with a "metal layer 16 for wiring line" illustrated, for example, in FIG. 8 of Japanese Unexamined Patent Application Publication No. 2000-340566, polishing may be applied to a portion that should be left. On the other hand, with the first plating film pattern 16 and the second plating film pattern 17 having a two-layer structure as with the semiconductor device 1 according to the present embodiment, it is possible to terminate the polishing process at a stage where the second portion 16B and the fourth portion 17B each serving as the upper layer are exposed. This makes it possible to avoid polishing the first portion 16A and the third portion 17A that should be left.

Furthermore, in a case of the semiconductor device 1 according to the present embodiment, the first plating film pattern 16 and the second plating film pattern 17 have an inverted T shape in cross section. That is, the area in which the second portion 16B is formed is smaller than the area in which the first portion 16A is formed. Similarly, the area in which the fourth portion 17B is formed is smaller than the area in which the third portion 17A is formed. This improves the degree of freedom of the first plating film pattern 16 and the second plating film pattern 17 in terms of design. That is, the degree of freedom in terms of design improves, as compared with a case of a T shape in cross section as with the "through electrode 12" illustrated in FIGS. 5A and 5B or the like in PTL 1, for example. One reason for this is that restriction on the second portion 16B and the fourth portion 17B in terms of size or installation position is lessened. Note that FIGS. 1A and 1B each illustrate, as an example, a case in which the central position of the first portion 16A and the central position of the second portion 16B match in the plurality of first plating film patterns 16. However, in a case of the present disclosure, it is only necessary that at least a portion of the second portion 16B overlaps with at least a portion of the first portion 16A in a stacked direction (in the Z axis direction). This similarly applies to the plurality of second plating film patterns 17. That is, in a case of the present disclosure, it is only necessary that at least a portion of the fourth portion 17B overlaps with at least a portion of the third portion 17A in a stacked direction (in the Z axis direction).

Furthermore, in a case of the semiconductor device 1 according to the present embodiment, the upper surface 16BS of the second portion 16B, the upper surface 17BS of the fourth portion 17B, and the upper surface 18A of the planarizing film 18 all have substantially the same height position. Thus, the surface 1S has high planarity. This makes it possible to, for example, easily couple the first plating film pattern 16 to a wiring line provided on another substrate or the like at the time of mounting the semiconductor device 1 on a member such as the other substrate, for example, achieving improved handleability.

In addition, with the semiconductor device 1 according to the present embodiment, in a case where the first plating film pattern 16 and the second plating film pattern 17 include substantially the same constituent material, it is possible to form the first plating film pattern 16 and the second plating film pattern 17 at one time. Thus, this case is advantageous in terms of improving productivity at the time of manufacturing the semiconductor device 1.

Moreover, in a case of the semiconductor device 1 according to the present embodiment, a plurality of second plating film patterns 17 is disposed between the first plating film pattern group 16G1 and the first plating film pattern group 16G2 in the in-plane direction along the front surface 12A. Thus, in a case where the distance between the first plating film pattern group 16G1 and the first plating film pattern group 16G2 is relatively large, a surface density of a plating film exposed at the surface 1S of the semiconductor device 1 is effectively averaged. This makes it possible to reduce, in the entire semiconductor device 1, a variation in thickness of each of the plating films in the in-plane direction of the surface 1S, in other words, reduce a variation in the total thickness of the thickness of the first portion 16A and the thickness of the second portion 16B. Thus, planarity of the surface 1S of the semiconductor device 1 improves.

2. Modification Examples of First Embodiment: Modification Examples of Semiconductor Device 2.1 First Modification Example

[Configuration of Semiconductor Device 1A]

Next, a semiconductor device 1A according to a first modification example (referred to as modification example 1) of the first embodiment will be described with reference to FIGS. 3A and 3B. FIG. 3A illustrates a configuration of the semiconductor device 1A in cross section. FIG. 3B illustrates a planar configuration of the semiconductor device 1A. FIG. 3A is a cross-sectional view taken along the cutting line IIIA-IIIA illustrated in FIG. 3B and viewed in the direction of the arrow. In the semiconductor device 1A, a plurality of third portions 17A in a plurality of second plating film patterns 17 provided in the second regional portion R2 is coupled to each other. Apart from this point, the semiconductor device 1A according to the modification example 1 has substantially the same configuration as that of the semiconductor device 1 according to the first embodiment described above.

[Workings and Effects of Semiconductor Device 1A]

In a case of the semiconductor device 1A according to the modification example 1, it is possible to increase the area of the third portion 17A without expanding the entire size within the X-Y plane, as compared with the semiconductor device 1. This makes a semiconductor device 1C according to the modification example 1 advantageous in terms of more efficiently radiating, to the outside, heat generated therewithin, as compared with the semiconductor device 1. Note that, in a case of the semiconductor device 1A according to the modification example 1, all the third portions 17A in the second plating film pattern 17 are coupled. However, the present disclosure is not limited to this. For example, any two or more third portions 17A of the third portions 17A of the plurality of second plating film patterns 17 may be coupled to each other.

2.2 Second Modification Example

[Configuration of Semiconductor Device 1B]

FIG. 4 illustrates a planar configuration of a semiconductor device 1B according to a second modification example (referred to as modification example 2) of the first embodiment described above. In the semiconductor device 1B according to the modification example 2, a plurality of groups, each of which is configured such that any two or more third portions 17A are coupled to each other, is disposed to be spaced apart from each other. Specifically, in the semiconductor device 1B, for example, a first group 17G1 located on the left side on the paper surface and a second group 17G2 located on the right side on the paper surface of the plurality of second plating film patterns 17 are disposed to be spaced apart from each other. Third portions 17A in the plurality of second plating film patterns 17 that constitute the first group 17G1 are coupled integrally to each other. Third portions 17A in the plurality of second plating film patterns 17 that constitute the second group 17G2 are also coupled integrally to each other.

2.3 Third Modification Example

[Configuration of Semiconductor Device 1C]

Next, a semiconductor device 1C according to a third modification example (referred to as modification example 3) of the first embodiment will be described with reference to FIGS. 5A and 5B. FIG. 5A illustrates a configuration of the semiconductor device 1C in cross section. FIG. 5B illustrates a planar configuration of the semiconductor device 1C. FIG. 5A is a cross-sectional view taken along the cutting line VA-VA illustrated in FIG. 5B and viewed in the direction of the arrow. In a case of the semiconductor device 1C, a plurality of third portions 17A in some second plating film patterns 17-1 from among a plurality of second plating film patterns 17 provided in the second regional portion R2 is coupled to each other. A plurality of third portions 17A in the other second plating film patterns 17-2 from among the plurality of second plating film patterns 17 is spaced apart from each other. In addition, the semiconductor substrate 12 includes a through hole 12H2 running from the front surface 12A to the back surface 12B. The second plating film pattern 17-1 further includes a through-hole portion 17C provided on the through hole 12H2 and coupled to the third portion 17A. Furthermore, a ground terminal GND embedded, for example, in the insulating layer 11 is provided in the vicinity of the back surface 12B of the semiconductor substrate 12. The through-hole portion 17C is coupled to this ground terminal GND. Apart from the point described above, the semiconductor device 1C according to the modification example 3 has substantially the same configuration as that of the semiconductor device 1 according to the first embodiment described above.

[Workings and Effects of Semiconductor Device 1C]

In a case of the semiconductor device 1C according to the modification example 1, it is possible to increase the area of the third portion 17A without expanding the entire size within the X-Y plane, as compared with the semiconductor device 1. This makes the semiconductor device 1C according to the modification example 3 advantageous in terms of more efficiently radiating, to the outside, heat generated therewithin, as compared with the semiconductor device 1. In addition, since the through-hole portion 17C of the second plating film pattern 17 is coupled to the ground terminal GND, it is possible to expect that a heat dissipating performance further improves. Moreover, it is possible to adjust a stray capacity of the second plating film pattern 17.

2.4 Fourth Modification Example

[Configuration of Semiconductor Device 1D]

Next, a semiconductor device 1D according to a fourth modification example (referred to as modification example 4) of the first embodiment will be described with reference to FIGS. 6A and 6B. FIG. 6A illustrates a configuration of the semiconductor device 1D in cross section. FIG. 6B illustrates a planar configuration of the semiconductor device 1D. FIG. 6A is a cross-sectional view taken along the cutting line VIA-VIA illustrated in FIG. 6B and viewed in the direction of the arrow. In the semiconductor device 1D according to the modification example 4, a plurality of third portions 17A in some second plating film patterns 17-1 provided in the second regional portion R2 is coupled to each other, as with the semiconductor device 1C according to the modification example 3. A plurality of third portions 17A in the other second plating film patterns 17-2 from among the plurality of second plating film patterns 17 is spaced apart from each other. In addition, in the semiconductor device 1D, a heat dissipating portion 25 including electrically conductive patterns 25A to 25C exposed at the surface 1S is provided on the semiconductor substrate 12 with the insulating layer 15 in between. The electrically conductive patterns 25A to 25C include, for example, Cu (copper) or other material having a high thermal conductive property. The electrically conductive patterns 25A to 25C are coupled to the third portion 17A in the second plating film pattern 17-1. Apart from the point described above, the semiconductor device 1D according to the modification example 4 has substantially the same configuration as that of the semiconductor device 1 according to the first embodiment described above.

[Workings and Effects of Semiconductor Device 1D]

In a case of the semiconductor device 1D according to the modification example 1, it is possible to increase the area of the third portion 17A without expanding the entire size within the X-Y plane, as compared with the semiconductor device 1. This makes the semiconductor device 1D according to the modification example 4 advantageous in terms of more efficiently radiating, to the outside, heat generated therewithin, as compared with the semiconductor device 1. In addition, since the heat dissipating portion 25 is provided, and the third portion 17A in the second plating film pattern 17-1 and the heat dissipating portion 25 are coupled to each other, it is possible to expect that a heat dissipating performance further improves.

3. Second Embodiment: Semiconductor Unit

[Configuration of Semiconductor Unit 2]

Next, a semiconductor unit 2 according to a second embodiment of the present disclosure will be described with reference to FIG. 7. FIG. 7 is a cross-sectional view of an example of an entire configuration of the semiconductor unit 2. This semiconductor unit 2 includes a wiring substrate 20 joined to the surface 1S of the semiconductor device 1 according to the first embodiment described above.

As illustrated in FIG. 7, the wiring substrate 20 has a stacked structure in which an insulating layer 19A, an insulating layer 19B, and an insulating layer 19C are stacked sequentially from a side that is in contact with the surface 1S. The wiring substrate 20 has one end sticking out from the semiconductor device 1 and having a surface provided with a heat dissipating portion 22 including, for example, a metal material having a high thermal conductive property. The insulating layer 19B is provided with a wiring line 24 that allows, for example, a signal current to be supplied. The wiring line 24 is coupled to the second portion 16B through a via 23 that penetrates through the insulating layer 19A. In addition, the insulating layer 19C is provided with a wiring line 21B extending, for example, in an X axis direction. The wiring line 21B is coupled to the fourth portion 17B and the heat dissipating portion 22 through a via 21A and a via 21C, respectively. The via 21A and the via 21C each penetrate through both of the insulating layer 19A and the insulating layer 19B.

[Workings and Effects of Semiconductor Unit 2]

As described above, the semiconductor unit 2 according to the present embodiment includes the semiconductor device 1 described in the first embodiment described above. Thus, the semiconductor unit 2 has a structure in which the wiring substrate 20 is attached with high accuracy to the surface 1S having high planarity. The wiring substrate 20 includes the heat dissipating portion 22. The heat dissipating portion 22 is coupled to the second plating film pattern 17 in the semiconductor device 1, for example, through the wiring line 21B. This allows heat generated within the semiconductor device 1 to be efficiently radiated to the outside, which makes it possible to achieve stable operation of the semiconductor device 1.

4. Modification Example of Second Embodiment: Modification Example of Semiconductor Unit

4.1 First Modification Example

[Configuration of Semiconductor Unit 2A]

Next, a semiconductor unit 2A according to a first modification example (referred to as modification example 5) of the second embodiment will be described with reference to FIGS. 8A and 8B. FIG. 8A illustrates a configuration of the semiconductor unit 2A in cross section. FIG. 8B illustrates a planar configuration of the semiconductor unit 2A. FIG. 8A is a cross-sectional view taken along the cutting line VIIIA-VIIIA illustrated in FIG. 8B and viewed in the direction of the arrow. In a case of the semiconductor unit 2A, for example, the first portion 16A in a portion of the first plating film pattern 16 in the first plating film pattern group 16G1 and the third portion 17A in a portion of the second plating film pattern 17 are integrated (also referred to as sharing). That is, for example, the second portion 16B and the fourth portion 17B are disposed side by side on one first portion 16A. The fourth portion 17B provided on the first portion 16A is coupled to the wiring line 21B through the via 21A, as with the fourth portion 17B in another second plating film pattern 17.

[Workings and Effects of Semiconductor Unit 2A]

Unlike the semiconductor unit 2, in a case of the semiconductor unit 2A according to the modification example 5, the first portion 16A electrically continuous with the transistor 13 provided within the semiconductor device 1 is coupled directly through the via 21A and the wiring line 21B to the heat dissipating portion 22. This is advantageous in terms of more efficiently radiating, to the outside, heat generated within the semiconductor device 1.

4.2 Second Modification Example

[Configuration of Semiconductor Unit 2B]

Next, a semiconductor unit 2B according to a second modification example (referred to as modification example 6) of the second embodiment described above will be described with reference to FIG. 9. FIG. 9 illustrates a configuration of the semiconductor unit 2B in cross section. The semiconductor unit 2B is configured such that a wiring substrate 20A is attached to the semiconductor device 1D illustrated in FIGS. 6A and 6B. The semiconductor device 1D includes the heat dissipating portion 25 exposed at the surface 1S. The wiring substrate 20A includes a wiring line 21B1 exposed at the surface thereof. The wiring line 21B1 is configured to be brought into contact with the heat dissipating portion 25. The wiring substrate 20A further includes a wiring line 21B2 that couples the wiring line 21B1 and the via 21C. This allows the third portion 17A of the second plating film pattern 17 to be coupled to an external heat dissipating portion 22 through the heat dissipating portion 25, the wiring line 21B1, the wiring line 21B2, and the via 21C.

5. Third Embodiment: Imaging Unit

[Configuration of Imaging Unit 3]

Next, an imaging unit 3 according to a third embodiment of the present disclosure will be described with reference to FIG. 10. FIG. 10 is a cross-sectional view of an example of an entire configuration of the imaging unit 3. This imaging unit 3 includes a sensor structure body 30 joined to the surface 1S of the semiconductor device 1 according to the first embodiment described above.

The sensor structure body 30 has a structure in which an insulating layer 31, a semiconductor substrate 32, a transparent resin layer 33, and a protective substrate 34 such as a transparent glass are stacked sequentially from a position close to the surface 1S of the semiconductor device 1. The sensor structure body 30 further includes a twin contact 35 and a pixel array unit 36.

The pixel array unit 36 is configured such that a plurality of pixels, each of which includes a pixel transistor 37, a photodiode FD, a color filter CF, and an on-chip lens LNS, is arranged in an array manner in the X-Y plane. Note that FIG. 10 illustrates, as an example, a case in which five pixels are arranged in the X axis direction. However, the number of pixels is not limited to this.

For example, a pixel peripheral circuit 38 and the twin contact 35 are provided in a surrounding region of the pixel array unit 36. The twin contact 35 includes through electrodes 35A and 35B, and a coupling portion 35C that couples the through electrodes 35A and 35B. The through electrode 35A penetrates through a portion of the insulating layer 31 and the semiconductor substrate 32, and has one end coupled to the pixel peripheral circuit 38. The through electrode 35B penetrates through a portion of the insulating layer 11, the insulating layer 31, and the semiconductor substrate 32, and has one end coupled to the wiring line 14. The transistor 13 provided in the insulating layer 11 of the semiconductor device 1 constitutes a portion of a signal processing circuit into which a pixel signal is inputted through, for example, the pixel transistor 37, the pixel peripheral circuit 38, the twin contact 35, and the like.

This imaging unit 3 converts, into an electrical signal, light L or electromagnetic wave entering the imaging unit 3, for example, from above the paper surface. The light L sequentially passes through the protective substrate 34, the transparent resin layer 33, and the on-chip lens LNS to enter the photodiode FD. The photodiode FD performs photoelectric conversion on the entering light L. The pixel transistor 37 controls this photoelectric conversion operation, or controls operation to read out the electrical signal obtained through photoelectric conversion.

[Workings and Effects of Imaging Unit 3]

As described above, the imaging unit 3 according to the present embodiment includes the semiconductor device 1 described in the first embodiment described above. This enables other mounting substrates to be attached on the surface 1S having excellent planarity with high accuracy, the surface 1S being on the side opposite to the sensor structure body 30. This makes it possible to expect stable operation of the imaging unit 3.

6. Fourth Embodiment: Example of Application to Electronic Apparatus

FIG. 11 is a block diagram illustrating an example of a configuration of a camera 2000 serving as an electronic apparatus to which the present technology is applied.

The camera 2000 includes an optical unit 2001 including a lens group or the like, an imaging unit (imaging device) 2002 to which the imaging unit 3 illustrated, for example, in FIG. 10 is applied, and a DSP (Digital Signal Processor)

circuit 2003 serving as a camera-signal processing circuit. In addition, the camera 2000 also includes a frame memory 2004, a display 2005, a recording unit 2006, an operation unit 2007, and a power-supply unit 2008. The DSP circuit 2003, the frame memory 2004, the display 2005, the recording unit 2006, the operation unit 2007, and the power-supply unit 2008 are coupled to each other through a bus line 2009.

The optical unit 2001 receives light (image light) inputted from a subject to form an image on an image capturing plane of the imaging unit 2002. The imaging unit 2002 converts, into an electrical signal, the amount of inputted light formed on the image capturing plane using the optical unit 2001 on a pixel by pixel basis, and outputs it as a pixel signal.

The display 2005 includes, for example, a panel-type display such as a liquid crystal panel or an organic EL panel, and displays a moving image or still image captured using the imaging unit 2002. The recording unit 2006 causes a moving image or still image captured using the imaging unit 2002 to be recorded in a recording medium such as a hard disk or a semiconductor memory.

Under operation by a user, the operation unit 2007 gives an operation instruction concerning various functions that the camera 2000 has. The power-supply unit 2008 supplies various types of power supply serving as power supply used to operate the DSP circuit 2003, the frame memory 2004, the display 2005, the recording unit 2006, and the operation unit 2007, to these power-supply targets on an as-necessary basis.

As described above, by using, as the imaging unit 2002, the imaging unit 3 according to each of the embodiments described above, it is possible to expect stable operation.

7. Example of Application to Mobile Body

It is possible to apply the technology (present technology) according to the present disclosure to various types of products. For example, the technology according to the present disclosure may be achieved as a unit mounted on any type of mobile body such as an automobile, an electric car, a hybrid electric car, a motorcycle, a bicycle, a personal mobility, an airplane, a drone, a ship, or a robot.

FIG. 12 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 12, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 12, an audio speaker 12061, a display section 12062, and an instrument panel 12063 are illustrated as the output device. The display section 12062 may, for example, include at least one of an on-board display and a head-up display.

FIG. 13 is a diagram depicting an example of the installation position of the imaging section 12031.

In FIG. 13, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 13 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

These are descriptions of examples of a vehicle control system to which the technology according to the present disclosure is able to be applied. It is possible to apply the technology according to the present disclosure to the imaging section 12031 from among the configurations described above. Specifically, it is possible to apply the imaging unit 3 illustrated in FIG. 10 to the imaging section 12031. With the technology according to the present disclosure being applied to the imaging section 12031, it is possible to expect stable operation of the vehicle control system.

8. Other Modification Examples

These are descriptions of the present disclosure made by giving some embodiments and modification examples. However, the present disclosure is not limited to the embodiments or the like described above. It is possible to make various modifications. For example, in a case of the semiconductor device 1 according to the first embodiment described above, the planar shape of the second plating film pattern 17 has a circular shape. However, the present disclosure is not limited to this, and any shape is possible. For example, the third portion 17A and the fourth portion 17B in the second plating film pattern 17 may each have a rectangular planar shape, as with a semiconductor device 1E according to another modification example illustrated in FIG. 14. In addition, this similarly applies to the planar shape of each of the first portion 16A and the second portion 16B in the first plating film pattern 16. These planar shapes are not limited to the circular shape. Furthermore, installation positions, shapes, and sizes of the first plating film pattern and the second plating film pattern according to the present disclosure, as well as the other constituent elements are not limited to those described in the embodiments or the like described above. It is possible to set them to any installation positions, shapes, and sizes.

It should be noted that the effects described in the present specification are merely examples, and are not given for the purpose of limitation. Other effects may be possible. In addition, it is possible for the present technology to have configurations described below.

(1)

A semiconductor device, including:
 a semiconductor substrate that has a first surface and a second surface on a side opposite to the first surface;
 a first plating film pattern that includes a first portion and a second portion, the first portion covering a first regional portion of the first surface, the second portion being stacked to cover a portion of the first portion;
 a second plating film pattern that includes a third portion and a fourth portion, the third portion covering a second regional portion different from the first regional portion of the first surface, the fourth portion being stacked to cover a portion of the third portion; and an insulating layer with which a portion between the second portion and the fourth portion is filled.

(2)

The semiconductor device according to (1), in which an upper surface of the second portion, an upper surface of the fourth portion, and an upper surface of the insulating layer are located at substantially an identical height position.

(3)

The semiconductor device according to (1) or (2), in which the first plating film pattern includes a constituent material that is substantially identical to a constituent material of the second plating film pattern.

(4)

The semiconductor device according to any one of (1) to (3), in which the first plating film pattern and the second plating film pattern are electrically separate from each other.

(5)

The semiconductor device according to any one of (1) to (3), in which the first portion in the first plating film pattern and the third portion in the second plating film pattern are integrated together.

(6)

The semiconductor device according to any one of (1) to (5), in which
 the semiconductor substrate further includes a first through hole running from the first surface to the second surface, and
 the first plating film pattern further includes a first through-hole portion provided on the first through hole and coupled to the first portion.

(7)

The semiconductor device according to (6), further including
 a semiconductor element provided near the second surface of the semiconductor substrate, in which
 the first through-hole portion is coupled to the semiconductor element.

(8)

The semiconductor device according to (7), in which
 the semiconductor substrate further includes a second through hole running from the first surface to the second surface, and
 the second plating film pattern further includes a second through-hole portion provided on the second through hole and coupled to the third portion.

(9)

The semiconductor device according to (8), further including
 a ground terminal provided near the second surface of the semiconductor substrate, in which
 the second through-hole portion is coupled to the ground terminal.

(10)

The semiconductor device according to any one of (6) to (9), including:
 a plurality of the first plating film patterns; and
 a plurality of the second plating film patterns disposed between the plurality of first plating film patterns in an in-plane direction along the first surface.

(11)

The semiconductor device according to (10), in which a plurality of the third portions in the plurality of second plating film patterns is coupled to each other.

(12)

The semiconductor device according to (11), in which the plurality of third portions is coupled to an external heat dissipating portion.

(13)

An imaging unit, including:
 an imaging device; and
 a semiconductor device on which the imaging device is mounted,
 the semiconductor device including
 a semiconductor substrate that has a first surface and a second surface on a side opposite to the first surface,
 a first plating film pattern that includes a first portion and a second portion, the first portion covering a first regional portion of the first surface, the second portion being stacked to cover a portion of the first portion,
 a second plating film pattern that includes a third portion and a fourth portion, the third portion covering a second regional portion different from the first regional portion of the first surface, the fourth portion being stacked to cover a portion of the third portion, and an insulating layer with which a portion between the second portion and the fourth portion is filled.

(14)

An electronic apparatus, including:
an imaging device; and
a semiconductor device on which the imaging device is mounted,
the semiconductor device including
a semiconductor substrate that has a first surface and a second surface on a side opposite to the first surface,
a first plating film pattern that includes a first portion and a second portion, the first portion covering a first regional portion of the first surface, the second portion being stacked to cover a portion of the first portion,
a second plating film pattern that includes a third portion and a fourth portion, the third portion covering a second regional portion different from the first regional portion of the first surface, the fourth portion being stacked to cover a portion of the third portion, and an insulating layer with which a portion between the second portion and the fourth portion is filled.

The present application claims priority based on Japanese Patent Application No. 2018-46712 filed with the Japan Patent Office on Mar. 14, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device, comprising:
a semiconductor substrate that has a first surface and a second surface on a side opposite to the first surface;
a first metal film pattern that includes a first portion and a second portion, wherein
the first portion covers a first regional portion of the first surface,
the second portion is stacked on the first portion,
the second portion is smaller in area than the first portion in a plan view such that the second portion covers a portion of an upper surface of the first portion in the plan view,
the upper surface of the first portion is parallel to the first surface of the semiconductor substrate,
the second portion includes a third surface and a fourth surface on a side opposite to the third surface, and
the third surface is substantially parallel to the fourth surface;
a second metal film pattern that includes a third portion and a fourth portion, wherein
the third portion covers a second regional portion of the first surface different from the first regional portion of the first surface, and
the fourth portion is stacked on the third portion to cover a portion of the third portion; and
an insulating layer between the second portion and the fourth portion.

2. The semiconductor device according to claim 1, wherein an upper surface of the second portion, an upper surface of the fourth portion, and an upper surface of the insulating layer are at substantially an equal height position in a thickness direction of the semiconductor device.

3. The semiconductor device according to claim 1, wherein the first metal film pattern further includes a constituent material that is substantially identical to a constituent material of the second metal film pattern.

4. The semiconductor device according to claim 1, wherein the first metal film pattern is electrically separated from the second metal film pattern.

5. The semiconductor device according to claim 1, wherein the first portion in the first metal film pattern is integrated to the third portion in the second metal film pattern.

6. The semiconductor device according to claim 1, wherein
the semiconductor substrate further includes a first through hole from the first surface to the second surface,
the first metal film pattern further includes a first through-hole portion on the first through hole, and
the first through-hole portion is coupled to the first portion.

7. The semiconductor device according to claim 6, further comprising a semiconductor element near the second surface of the semiconductor substrate, wherein the first through-hole portion is further coupled to the semiconductor element.

8. The semiconductor device according to claim 7, wherein
the semiconductor substrate further includes a second through hole from the first surface to the second surface, and
the second metal film pattern further includes a second through-hole portion on the second through hole, and
the second through-hole portion is coupled to the third portion.

9. The semiconductor device according to claim 8, further comprising a ground terminal near the second surface of the semiconductor substrate, wherein the second through-hole portion is further coupled to the ground terminal.

10. The semiconductor device according to claim 6, further comprising:
a plurality of first metal film patterns including the first metal film pattern; and
a plurality of second metal film patterns between the plurality of first metal film patterns in an in-plane direction along the first surface, wherein the plurality of second metal film patterns includes the second metal film pattern.

11. The semiconductor device according to claim 10, wherein
the plurality of second plating film patterns includes a plurality of third portions coupled to each other, and
the plurality of third portions includes the third portion.

12. The semiconductor device according to claim 11, wherein the plurality of third portions is coupled to an external heat dissipating portion.

13. The semiconductor device according to claim 1, wherein the first metal film pattern and the second metal film pattern each form an inverted T shape in a cross-section view.

14. The semiconductor device according to claim 1, wherein the second portion partially overlaps the upper surface of the first portion in a thickness direction of the semiconductor device.

15. The semiconductor device according to claim 1, further comprising a planarizing film that fills at least a portion between the second portion and the fourth portion.

16. The semiconductor device according to claim 15, wherein the planarizing film covers the insulating layer and fills a space between the first portion and the third portion.

17. The semiconductor device according to claim 15, wherein the planarizing film comprises an organic insulating material.

18. An imaging unit, comprising:
   an imaging device; and
   a semiconductor device on which the imaging device is mounted, wherein the semiconductor device includes:
      a semiconductor substrate that has a first surface and a second surface on a side opposite to the first surface;
      a first metal film pattern that includes a first portion and a second portion, wherein
         the first portion covers a first regional portion of the first surface,
         the second portion is stacked on the first portion,
         the second portion is smaller in area than the first portion in a plan view such that the second portion covers a portion of an upper surface of the first portion in the plan view,
         the upper surface of the first portion is parallel to the first surface of the semiconductor substrate,
         the second portion includes a third surface and a fourth surface on a side opposite to the third surface, and
         the third surface is substantially parallel to the fourth surface;
      a second metal film pattern that includes a third portion and a fourth portion, wherein
         the third portion covers a second regional portion of the first surface different from the first regional portion of the first surface, and
         the fourth portion is stacked on the third portion to cover a portion of the third portion; and
      an insulating layer between the second portion and the fourth portion.

19. An electronic apparatus, comprising:
   an imaging device; and
   a semiconductor device on which the imaging device is mounted, wherein the semiconductor device includes:
      a semiconductor substrate that has a first surface and a second surface on a side opposite to the first surface;
      a first metal film pattern that includes a first portion and a second portion, wherein
         the first portion covers a first regional portion of the first surface,
         the second portion is stacked on the first portion,
         the second portion is smaller in area than the first portion in a plan view such that the second portion covers a portion of an upper surface of the first portion in the plan view,
         the upper surface of the first portion is parallel to the first surface of the semiconductor substrate,
         the second portion includes a third surface and a fourth surface on a side opposite to the third surface, and
         the third surface is substantially parallel to the fourth surface;
      a second metal film pattern that includes a third portion and a fourth portion, wherein
         the third portion covers a second regional portion of the first surface different from the first regional portion of the first surface, and
         the fourth portion is stacked on the third portion to cover a portion of the third portion; and
      an insulating layer between the second portion and the fourth portion.

\* \* \* \* \*